United States Patent
Kashiwazaki

(10) Patent No.: US 7,221,058 B2
(45) Date of Patent: May 22, 2007

(54) SUBSTRATE FOR MOUNTING SEMICONDUCTOR CHIP, MOUNTING STRUCTURE OF SEMICONDUCTOR CHIP, AND MOUNTING METHOD OF SEMICONDUCTOR CHIP

(75) Inventor: Atsushi Kashiwazaki, Anjo (JP)

(73) Assignee: Denso Corporation, Kariya (JP)

( * ) Notice: Subject to any disclaimer, the term of this patent is extended or adjusted under 35 U.S.C. 154(b) by 38 days.

(21) Appl. No.: 10/950,400

(22) Filed: Sep. 28, 2004

(65) Prior Publication Data

US 2005/0116354 A1 Jun. 2, 2005

(30) Foreign Application Priority Data

Nov. 27, 2003 (JP) ............................. 2003-397794
Jul. 16, 2004 (JP) ............................. 2004-210626

(51) Int. Cl.
*H01L 23/48* (2006.01)
*H01L 23/52* (2006.01)
*H01L 29/40* (2006.01)

(52) U.S. Cl. ................ 257/778; 257/780; 257/E21.503
(58) Field of Classification Search ................ 257/758, 257/778, 779, 698, 700, 786, 737, 738, 773–775; 361/768–774, 783; 438/108, 117; 228/180.22
See application file for complete search history.

(56) References Cited

U.S. PATENT DOCUMENTS

| | | | |
|---|---|---|---|
| 5,980,270 A * | 11/1999 | Fjelstad et al. | 439/71 |
| 6,285,562 B1 * | 9/2001 | Zakel et al. | 361/768 |
| 6,492,737 B1 | 12/2002 | Imasu et al. | |
| 6,759,268 B2 * | 7/2004 | Akagawa | 438/106 |

FOREIGN PATENT DOCUMENTS

JP A-2000-91382 3/2000
JP A-2003-179098 6/2003

* cited by examiner

*Primary Examiner*—B. William Baumeister
*Assistant Examiner*—Dana Farahani
(74) *Attorney, Agent, or Firm*—Posz Law Group, PLC

(57) ABSTRACT

A substrate for mounting a semiconductor chip is formed as a multilayer substrate by alternately laminating insulation layers and wiring layers. Wires of the wiring layers are electrically connected through a via-hole for interlayer continuity. A through-hole provided through the insulation layer of the outermost surface layer is formed. A bump is inserted in the through-hole to a bump allocating position of the semiconductor chip to be mounted in the insulation layer of the outermost surface layer. A portion of the wire in the wiring layer of the outermost surface layer is projected to the internal side of through-hole at the aperture of the through-hole.

8 Claims, 23 Drawing Sheets

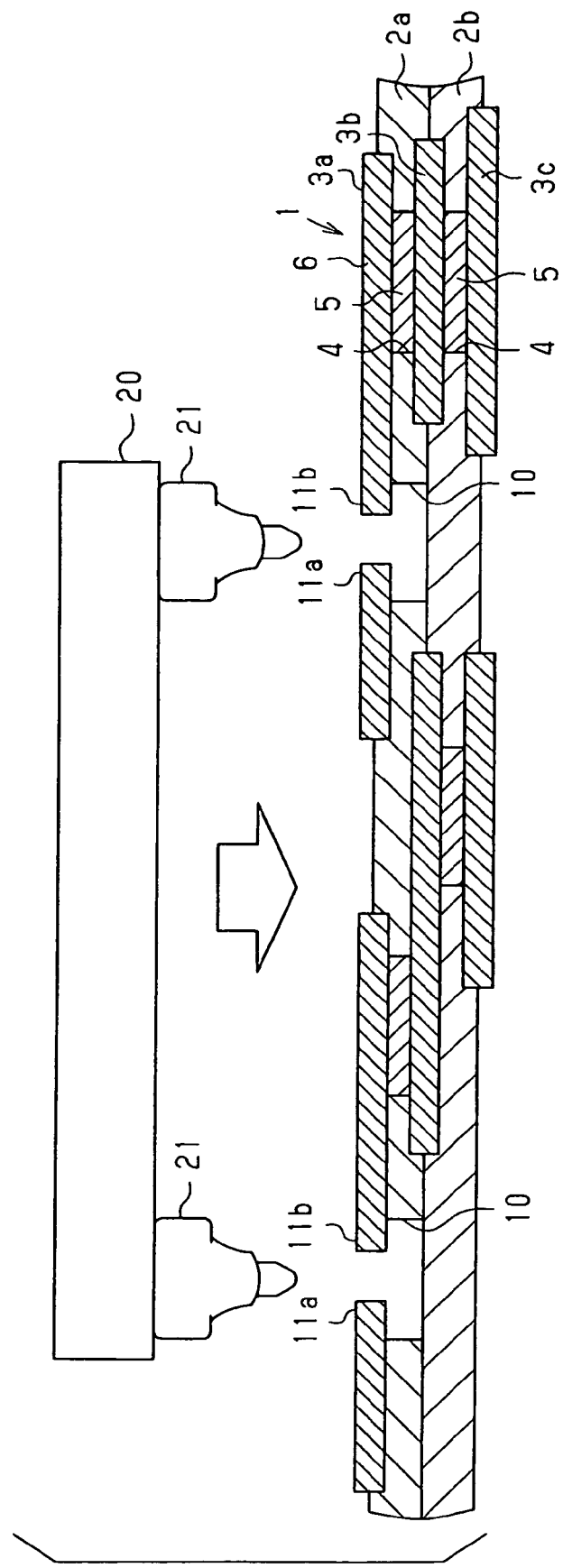

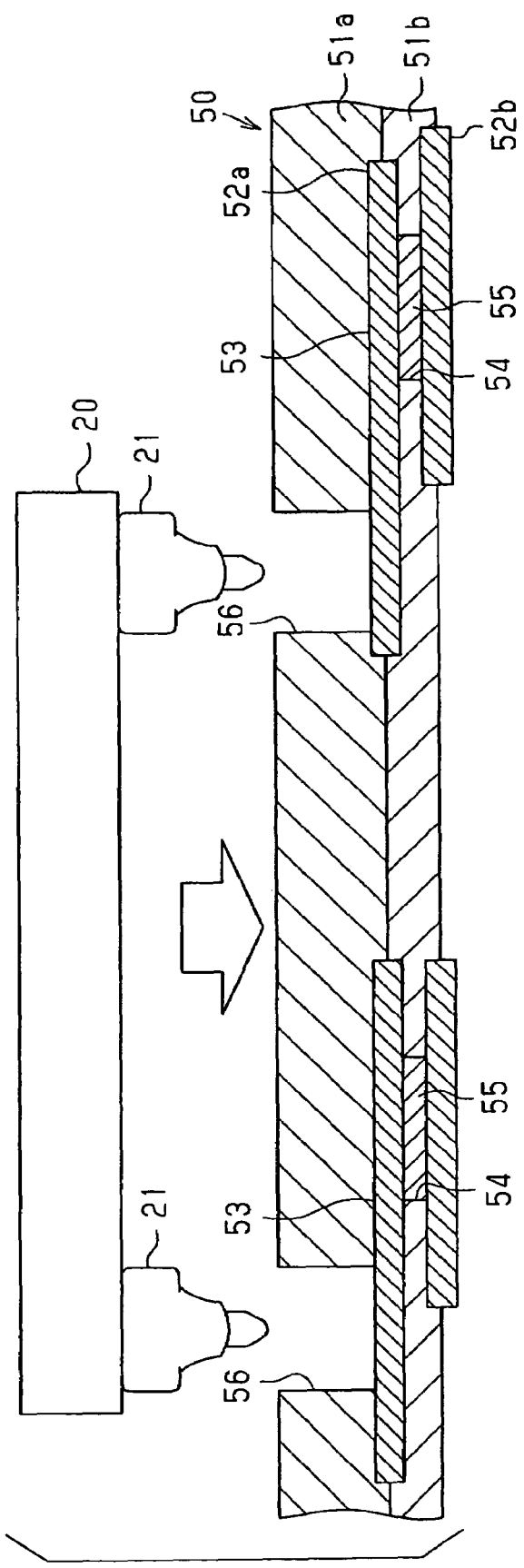
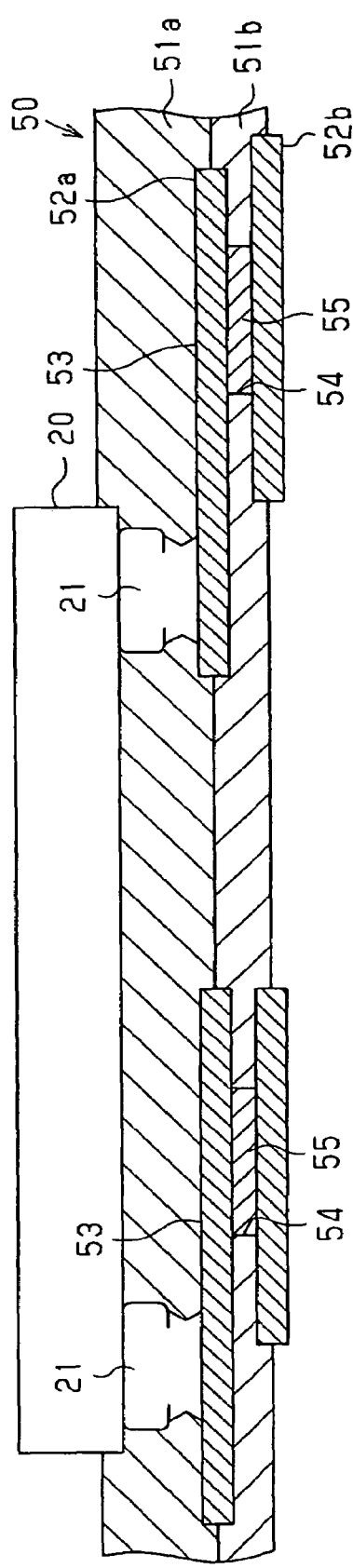

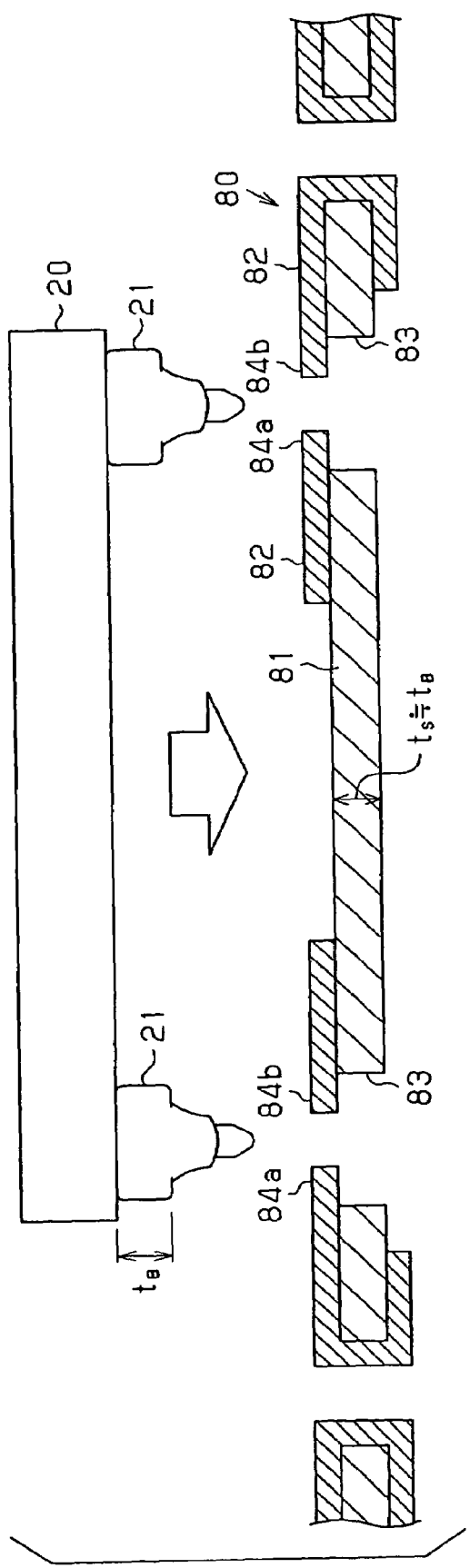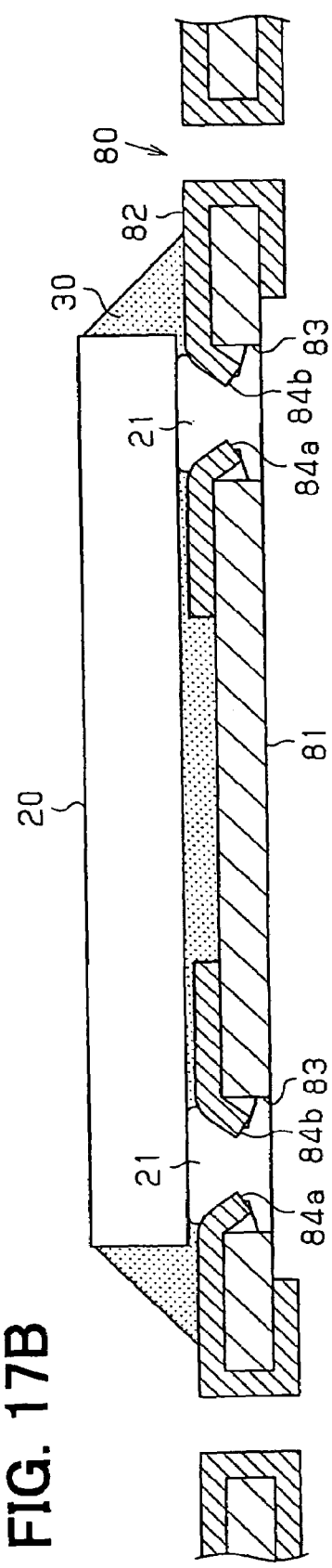

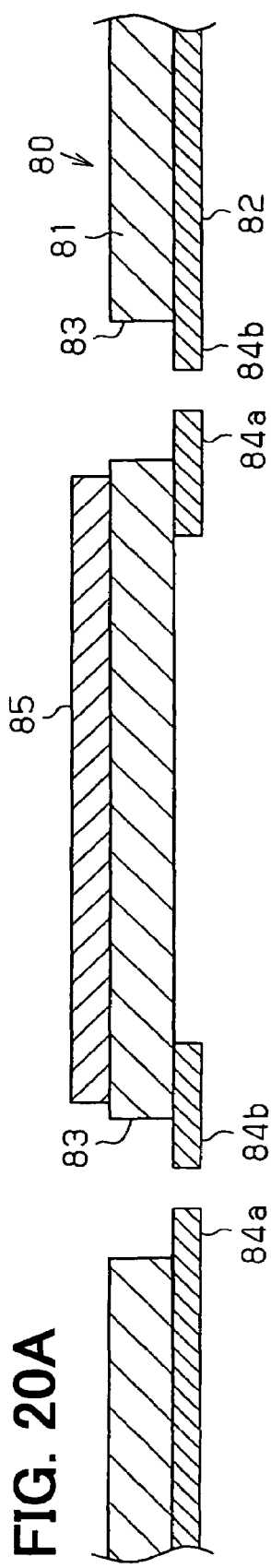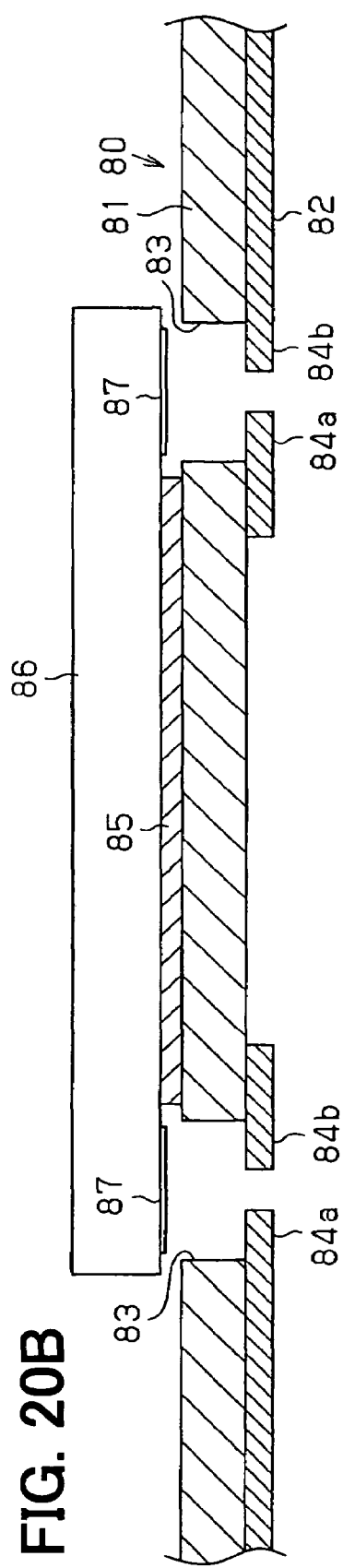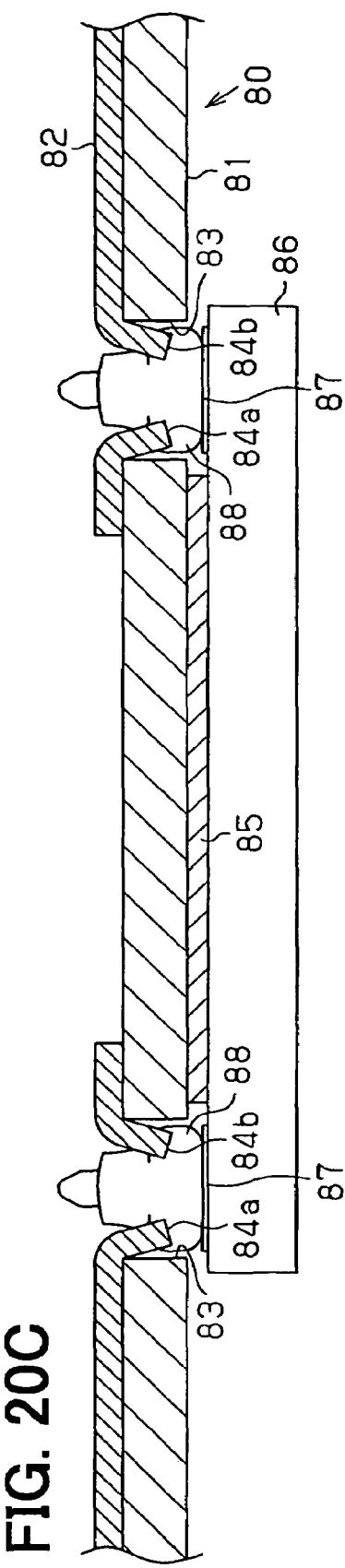

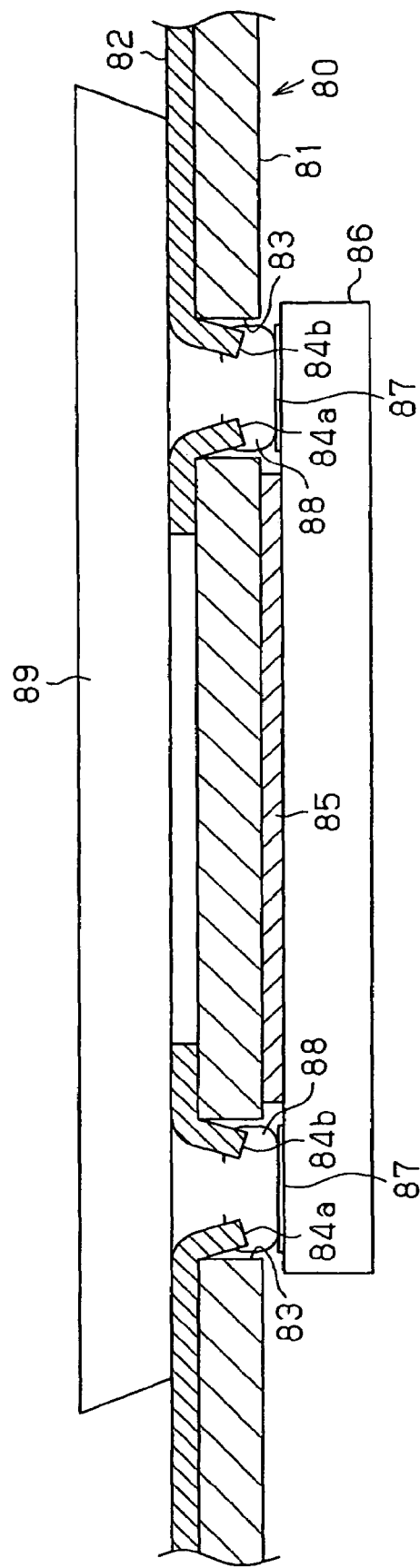
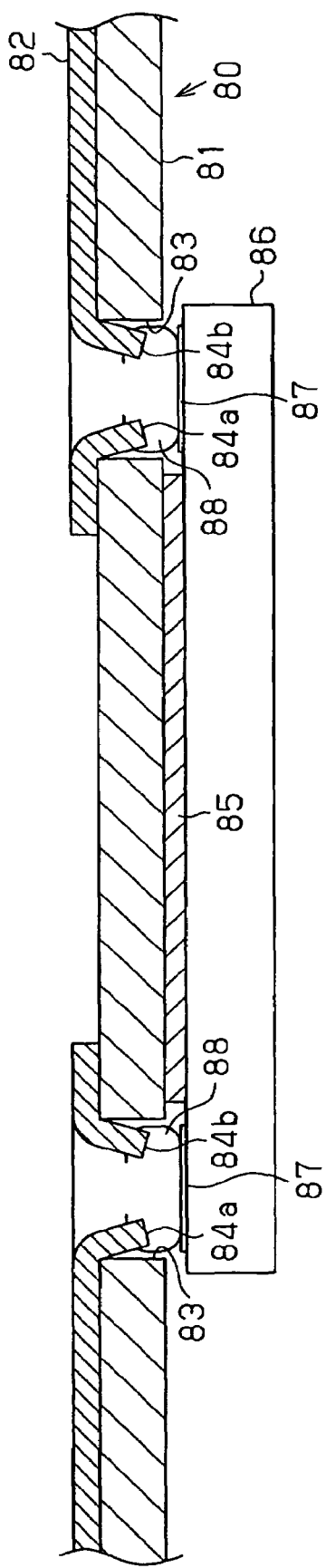
FIG. 21A
FIG. 21B

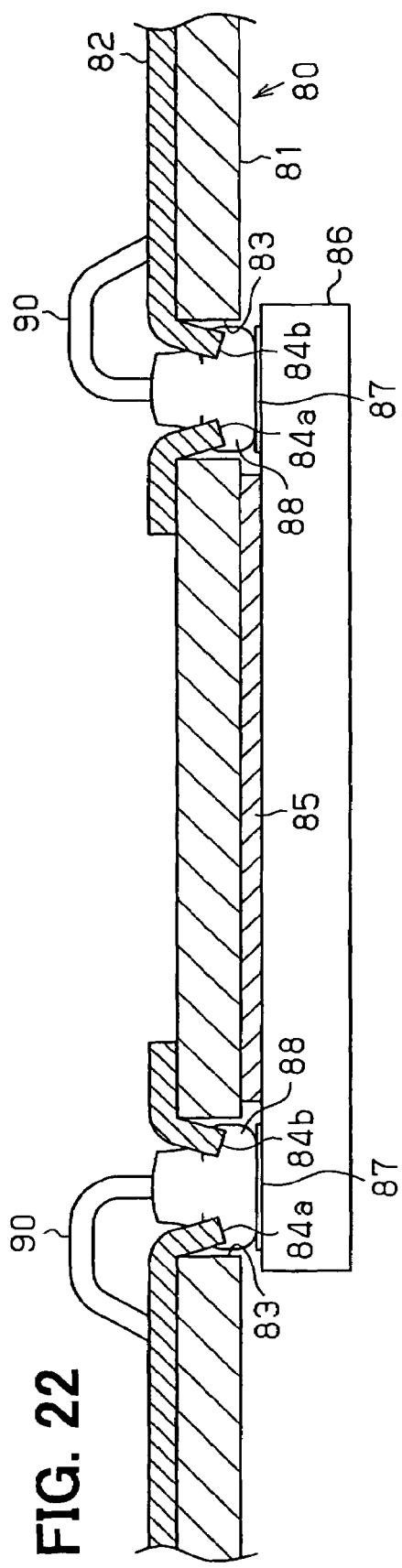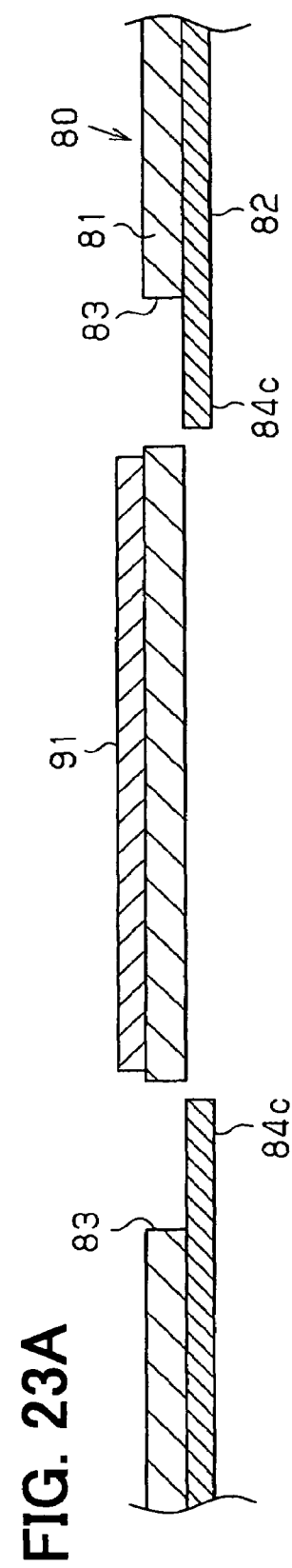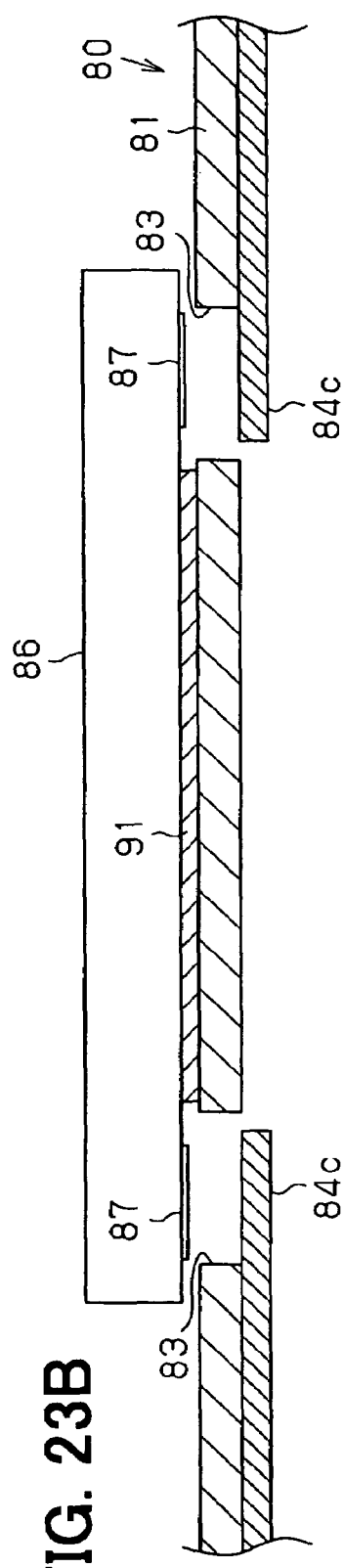

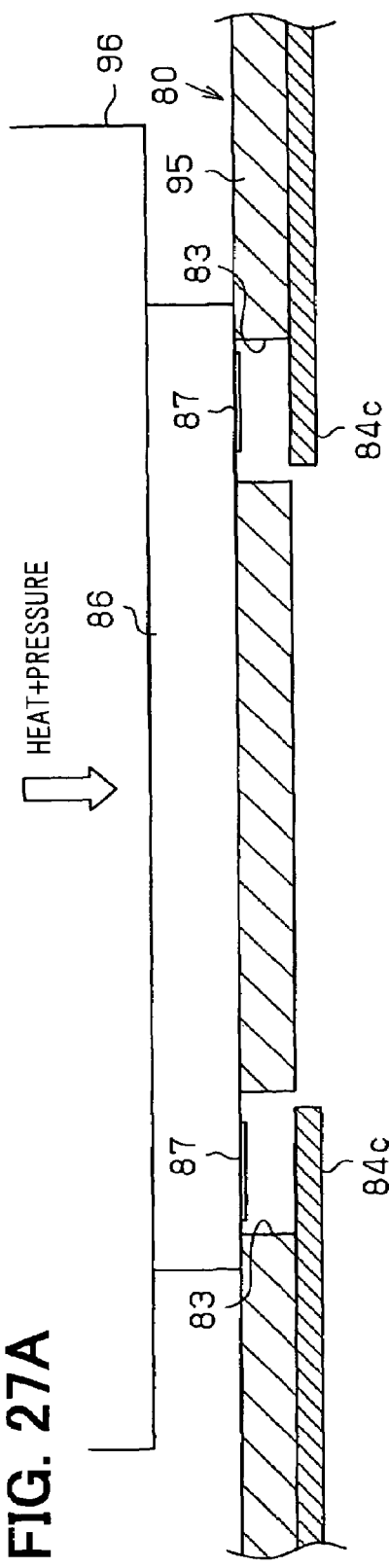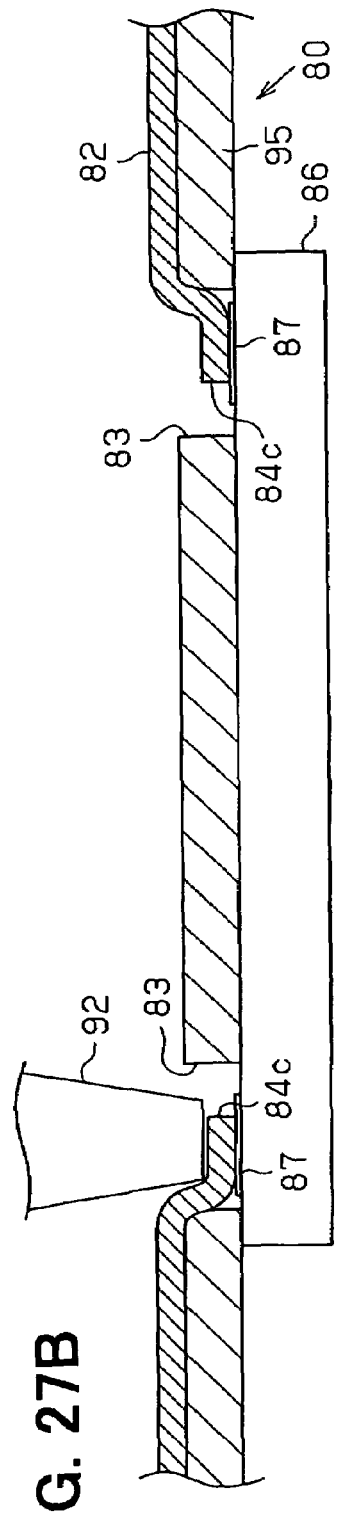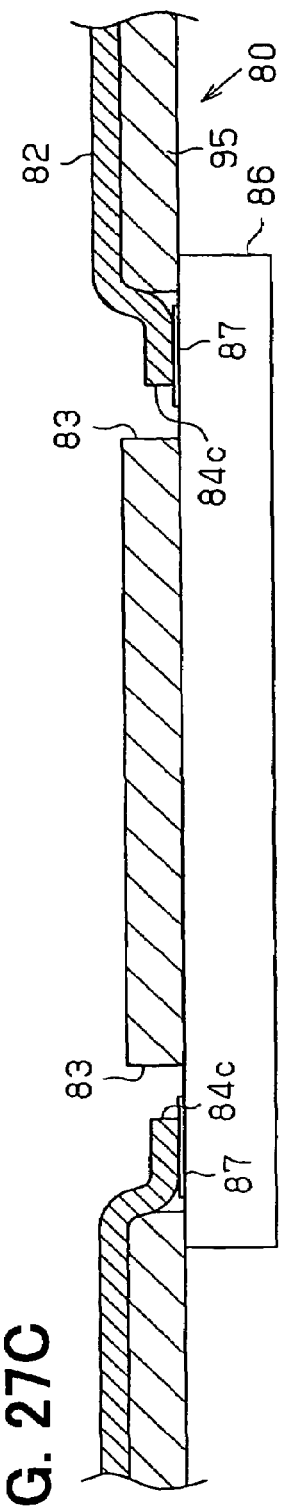

SUBSTRATE FOR MOUNTING SEMICONDUCTOR CHIP, MOUNTING STRUCTURE OF SEMICONDUCTOR CHIP, AND MOUNTING METHOD OF SEMICONDUCTOR CHIP

CROSS REFERENCE TO RELATED APPLICATIONS

This application is based upon, claims the benefit of priority of, and incorporates by reference the contents of Japanese Patent Application No. 2003-397794 filed on Nov. 27, 2003 and Japanese Patent Application No. 2004-210626 filed on Jul. 16, 2004.

FIELD OF THE INVENTION

The present invention relates generally to a substrate for mounting a semiconductor chip, a mounting structure of semiconductor chip, and a mounting method of semiconductor chip.

BACKGROUND OF THE INVENTION

Wire bonding and flip chip mounting have been proposed as methods for mounting a semiconductor chip. FIG. 28A illustrates a cross-sectional view of a flip chip mounted to a laminated substrate 100. In the flip chip mounting, a semiconductor chip 110 is mounted face down on the substrate 100 and connected to the substrate 100 through bumps 111. When high density mounting is required, a bonding pad is unnecessary for the periphery of semiconductor chip 110 and the flip chip which requires less occupation area on the substrate 100 of the semiconductor chip 110 is suitable. Moreover, as illustrated in FIG. 28B, as the flip chip structure to the single layer substrate 120, the chip 110 is allocated over the substrate 120 and bumps 111 and wires 121 are joined.

As a multilayer wiring substrate 100 for flip chip mounting required to realize high density wiring, interlayer continuity is realized not by using a through-hole (TH) which is provided through all layers but by an inner via-hole (IVH) 101 which may be individually arranged for each layer for enabling high density wiring. The inner via-hole (IVH) 101 can be formed to the laminated substrate which is represented by a ceramics multilayer substrate. The ceramics multiplayer substrate can be manufactured, as illustrated in FIG. 29, through the boring process of insulation base material, paste printing process, simultaneous laminating process, and simultaneous thermal baking process.

In recent years, a mobile computer is more and more required to realize reduction in size through the high density mounting technology because of increase in various control computers due to introduction of sophisticated functions of automobile (using electronic circuits) and reduction in mounting space of computer due to the requirement for expansion of the residential space. Therefore, for actual mounting of the semiconductor chip, adaptation of the flip chip bonding technology is required to realize higher density mounting. However, in the flip chip bonding, the substrates 100 and 120 and semiconductor chip 110 are bonded, as illustrated in FIGS. 28A and 28B, via a very small gap G (20 μm to 70 μm) through the bump 111. Therefore, stress generated due to difference in the line expansion coefficients of the semiconductor chip 110 and substrates 100 and 120 is concentrated to the bonding area of the bump 111 and substrates 100 and 120, resulting in the problem that the connecting portion is broken when the applied temperature is repeatedly changed. Because of such problem, application into such mobile computer to be placed under the severe operation environment becomes difficult.

SUMMARY OF THE INVENTION

The present invention has been proposed under the background described above and an object of the present invention is therefore to provide a substrate for mounting a semiconductor chip which assures higher connection reliability with a newly proposed structure, a mounting structure of semiconductor chip, and a mounting method of semiconductor chip.

A substrate for mounting a semiconductor chip according to a first aspect is characterized in that a through-hole provided through at least an insulation layer of the outermost surface layer is formed to insert a bump to the bump allocating position of semiconductor chip to be mounted at least in the insulation layer of the outermost surface layer and a part of wire at the wiring layer of the outermost surface layer is projected to the internal side of the through-hole at the aperture thereof. According to this substrate for mounting semiconductor chip, since the wire of the connecting portion to the bump by the flip chip connection is not fixed to the insulation layer (base material), the stress alleviating capability of wiring portion is improved to ensure higher reliability of the connection.

According to a second aspect, in the substrate for mounting semiconductor chip according to the first aspect, when the wire for flip chip connection is provided at the bottom portion of the through-hole provided through at least the insulation layer of the outermost surface layer, connection with the bump can be made even at the bottom surface of the through-hole, connecting area of the bump and wire can be increased, and connection reliability can also be improved.

According to a third aspect, in the substrate for mounting semiconductor chip according to the first or second aspect, the through-hole provided through at least the insulation layer of the outermost surface layer is also provided through the insulation layer on the internal layer side than the insulation layer of the outermost surface layer, and when a part of wire of wiring layer on the internal layer side than the wiring layer in the outermost surface layer is projected to the through-hole from the side wall of the through-hole, the connecting area to the bump can be increased and connection reliability can also be improved by providing the wire to be projected also from the side wall of the through-hole.

The mounting structure of semiconductor chip according to the fourth aspect is characterized in that the semiconductor chip provided with the bump is flip chip connected, under the condition that the bump and through-hole are matched in the position, to the substrate for mounting semiconductor chip according to any of the first to third aspects, and the wire which is deformed because the bump is inserted into the through-hole is electrically connected to the bump. According to this mounting structure of a semiconductor chip, the wire is deformed with the bump when the bump is inserted into the through-hole and is connected to the side surface of bump. In this case, since the wire of connecting portion to the bump is not fixed to the insulation layer (base material), the stress alleviating capability can be given to the wiring portion and thereby higher connection reliability can be attained.

The mounting method of semiconductor chip according to a fifth aspect is characterized in that the semiconductor chip provided with the bump is flip chip connected to the substrate for mounting semiconductor described in any of the first to third aspects through electrical connection of deformed wire and bump, while the bump is inserted into the through-hole while application of ultrasonic wave vibration and thereby a metal coupling is formed to the connecting portion of the bump and wire under the condition that the bump and through-hole are matched in the position. According to this mounting method of a semiconductor chip, since the bump is placed in contact with the newly generated surface which is generated by sharpening the surfaces of the bump and wire due to application of the ultrasonic wave vibration, the bump and wire surely form the metal coupling to improve the connection strength. As a result, connection reliability can be improved.

According to a sixth aspect, in the mounting structure of semiconductor chip according to the fourth aspect, when the connecting portion of the bump and wire in the through-hole is filled with silver paste, a connecting resistance can be lowered by filling the connecting portion of the bump and wire with the silver paste. Moreover, connection between the bump and wire can be reinforced. In addition, even if direct connection between the bump and wire is broken, since the indirect electrical connection is maintained with the silver paste, connection failure does not occur and higher connection reliability can be realized.

The substrate for mounting semiconductor chip according to a seventh aspect is characterized in that the through-hole provided through at least the insulation layer of the outermost surface layer is formed to insert the bump to the bump allocating position of semiconductor chip to be mounted in at least the insulation layer of the outermost surface layer, the wire for connection of bump is provided at the bottom portion of the through-hole, and at least the insulation layer of the outermost surface layer is formed of thermoplastic resin. According to this substrate for mounting semiconductor chip, the bump is accommodated within the through-hole and the substrate is connected with the bump at the bottom portion of through-hole. Accordingly, the active surface of the semiconductor chip can be placed in contact with the surface layer of substrate. Moreover, since the surface layer of the substrate is formed of thermoplastic resin, the connecting portion and active surface of semiconductor chip can be sealed simultaneously with the connection of bump with the heat and applied pressure at the time of flip chip mounting. Moreover, since the insulation layer of the outermost surface layer of the substrate is used as an under-fill material, stress at the connecting portion due to difference in the thermal expansion coefficients of chip and substrate can be alleviated and thereby higher connection reliability can be attained. In addition, the flip chip connection process can be simplified.

The substrate for mounting semiconductor chip according to an eighth aspect is characterized in that the through-hole provided through two insulation layers including at least the insulation layer of the outermost surface layer is formed to insert the bump to the bump allocating position of the semiconductor chip to be mounted in the two insulation layers including at least the insulation layer of the outermost surface layer, a part of wire of the wiring layer sandwiched by two insulation layers including at least the insulation layer of the outermost surface layer, to which the through-hole is formed, is projected into the through-hole, and at least the insulation layer of the outermost surface layer is formed of the the thermoplastic resin. According to this substrate for mounting the semiconductor chip, since the wire of the connecting portion to the bump by the flip chip connection is not fixed to the insulation layer (base material), the stress alleviating capability of the wiring portion can be improved. Moreover, since the surface layer of the substrate is formed with the thermoplastic resin, the connecting portion and active surface of semiconductor chip can be sealed simultaneously with connection of the bump with the heat and applied pressure at the time of flip chip mounting. In addition, since the insulation layer of the outermost surface layer of the substrate is used as the under-fill material, stress generated at the connecting portion due to difference in the thermal expansion coefficients of chip and substrate can be alleviated and thereby connection reliability can also be improved. Moreover, the flip chip connection process can also be simplified.

According to a ninth aspect, in the substrate for mounting semiconductor chip of the eighth aspect, since the wire for flip chip connection is provided at the bottom portion of the through-hole, connection with the bump can be realized even at the bottom surface of through-hole, connection area between the bump and wire can be increased, and connection reliability can also be improved.

The mounting structure of semiconductor chip according to a tenth aspect is characterized in that since the semiconductor chip provided with the bump is flip chip connected, under the condition that the bump and through-hole are matched in the position, to the substrate for mounting semiconductor chip according to any of the seventh to ninth aspects, and the wire and bump are electrically connected under the condition that since the bump is inserted into the through-hole, the active surface of semiconductor chip and the substrate for mounting semiconductor chip are bonded with the thermoplastic resin insulation layer of the outermost surface layer of the substrate for mounting semiconductor chip. According to this mounting structure of semiconductor chip, the wire and bump are connected when the bump is inserted into the through-hole. Moreover, since the insulation layer of the outermost surface layer of substrate is used as the under-fill material, stress generated at the connecting portion due to difference in the thermal expansion coefficients of the chip and substrate can be alleviated and thereby connection reliability can be improved.

The mounting method of semiconductor chip according to an eleventh aspect is characterized in that the semiconductor chip provided with the bump is flip chip connected to the substrate for mounting semiconductor chip according to any of the seventh to ninth aspects under the condition that the bump and through-hole are matched in the position, and the bump on the chip side and wire on the substrate side are electrically connected while the active surface of the semiconductor chip and substrate for mounting semiconductor chip are bonded with the thermosetting resin insulation film of the outermost surface layer of the substrate for mounting semiconductor chip by inserting the bump into the through-hole through application of at least heat and pressure. According to this mounting method of semiconductor chip, the active surface of the semiconductor chip can be placed in contact with the surface layer of substrate by accommodating the bump into the through-hole and making connection to the bump. Since the surface layer of the substrate is formed of the thermosetting resin, the connecting portion and active surface of the semiconductor chip can be sealed simultaneously with connection of bump with the heat and applied pressure at the time of flip chip connection. Moreover, since the insulation layer of the outermost surface layer of substrate is used as the under-fill material, higher connection reliability can be attained. Moreover, the flip chip connection process can be simplified.

According to a twelfth aspect, in the mounting method of semiconductor chip according to the eleventh aspect, when a metal coupling is formed at the connecting portion of the bump and wire through application of ultrasonic wave vibration, when the heat and pressure are applied, even in the longest period, from the time of the contact between the bump and the bottom portion of the through-hole until the time when the active surface of the semiconductor chip is in contact with the insulation layer of the outermost surface layer of the substrate for mounting semiconductor chip, the surfaces of bump and wire are sharpened with the ultrasonic wave vibration and the newly generated surfaces are placed in contact with each other. Accordingly, the metal coupling of bump and wire can surely be formed and thereby connection strength can be improved. Therefore, reliability of flip chip connection can further be improved. Moreover, since the ultrasonic wave vibration is not applied in the stage where the active surface of the semiconductor chip is placed in contact with the substrate surface, the simultaneous sealing with the thermoplastic resin at the surface layer can be realized and processes can also be simplified without resulting in any damage on the active surface of the semiconductor chip.

According to a thirteenth aspect, in the mounting structure of semiconductor chip according to the tenth aspect, when the connecting portion of the bump and wire is filled with the silver paste within the through-hole, the connection resistance can be lowered by filling the connecting portion of the bump and wire with the silver paste. Moreover, connection of bump and wire can be reinforced. Moreover, even when the direct connection of bump and wire is broken, connection failure does not occur and higher connection reliability can be realized because the electrical connection is maintained directly with the silver paste.

The substrate for mounting semiconductor chip according to a fourteenth aspect is characterized in that the through-hole provided through the insulation base material is formed to insert the bump at the bump allocating position of the semiconductor chip to be mounted and a part of wire is projected to the aperture of the through-hole at the aperture of the through-hole. According to this substrate for mounting semiconductor chip, since the wire of connecting portion to the bump by the flip chip connection is not fixed to the insulation base material, the stress alleviating capability of wiring portion can be improved and higher connection reliability can also be attained.

The mounting structure of semiconductor chip according to a fifteenth aspect is characterized in that the semiconductor chip provided with the bump is flip chip connected to the substrate for mounting semiconductor chip according to the fourteenth aspect, under the condition that the bump and through-hole are matched in the position, from the surface where a part of wire is projected to the aperture of the through-hole and the wire which is deformed because the bump is inserted into the through-hole is electrically connected to the bump. According to this mounting structure of semiconductor chip, since the wire of connecting portion to the bump with the flip chip connection is not fixed to the insulation base material, the stress alleviating capability of wiring portion can be improved and thereby the higher connection reliability can also be attained.

The mounting method of semiconductor chip according to a sixteenth aspect is characterized in that the semiconductor chip provided with the bump is flip chip connected to the substrate for mounting semiconductor chip according to the fourteenth aspect from the surface where a part of wire is projected to the aperture of the through-hole by electrically connecting the deformed wire and the bump, while the bump is inserted into the through-hole during application of ultrasonic wave vibration and a metal coupling is thereby formed at the connecting portion of the bump and wire under the condition that the bump and through-hole are matched in the position. According to this mounting method of semiconductor chip, since the surfaces of the bump and wire are sharpened with the ultrasonic wave vibration and thereby newly generated surfaces are placed in contact, the bump and wire surely form the metal coupling and thereby connection strength can be improved. Accordingly, higher connection reliability can be attained.

The mounting structure of semiconductor chip according to a seventeenth aspect is characterized in that the semiconductor chip is bonded, in the face down manner, to the substrate for mounting semiconductor chip according to the fourteenth aspect from the surface opposing to the surface where a part of wire is projected to the aperture of the through-hole, under the condition that the electrode and through-hole of the semiconductor chip are matched in the position, and the wire, which is deformed because the bump is inserted into the through-hole from the surface where a part of wire is projected to the aperture of through-hole and is bonded to the electrode of semiconductor chip, is electrically connected to the bump. According to this mounting structure of semiconductor chip, since the wire of the connecting portion to the bump by the flip chip connection is not fixed to the insulation base material, the stress alleviating capability of wiring portion can be improved and thereby higher connection reliability can also be attained.

According to an eighteenth aspect, in the mounting structure of semiconductor chip according to the seventeenth aspect, when the end part of the bump is wire-bonded to the wire, electrical connection of thinner wire can be attained and thereby the thin wire is capable of having the excellent stress alleviating property and reliability of this thin wire can be attained.

The mounting method of semiconductor chip according to a nineteenth aspect is characterized by comprising a first step for mounting the semiconductor chip, in the face down manner, through a bonding agent to the surface opposing to the surface where a part of wire is projected to the aperture of the through-hole of the substrate for mounting semiconductor chip according to a fourteenth aspect, under the condition that the electrode and through-hole of the semiconductor chip are matched in the position, and a second step for bonding the bump to the electrode of semiconductor chip by inserting the bump into the through-hole from the surface where a part of wire is projected to the aperture of through-hole in the substrate for mounting semiconductor chip. According to this mounting method of semiconductor chip, since the wire of the connecting portion to the bump by the flip chip connection is not fixed to the insulation base material, the stress alleviating capability of wiring portion can be improved and thereby higher connection reliability can also be attained. Moreover, mounting of bump to the electrode and connection of bump and wire can be conducted simultaneously in the bonding process of bump and thereby the process can be simplified.

According to a twentieth aspect, in the mounting method of semiconductor chip according to the nineteenth aspect, when a structural member of a bump projected from the surface of the substrate for mounting semiconductor chip is pressed and crushed from the surface side where a part of wire is projected to the aperture of through-hole after the bump is bonded to the electrode of semiconductor chip, since the bump is crushed (plastically deformed), the bonding area of the wire projected to the aperture of through-hole and bump is increased, and thereby reliability of electrical connection can be improved.

The substrate for mounting semiconductor chip according to a twenty-first aspect is characterized in that the through-hole provided through the insulation base material is formed to insert the end part of bonding tool at the position where the electrode of semiconductor chip to be mounted is allocated and a part of wire is projected to the aperture of the through-hole at the aperture of the through-hole. According to this substrate for mounting semiconductor chip, since the wire of the connecting portion to the electrode on the side of chip by flip chip connection is not fixed to the insulation base material, the stress alleviating capability of wiring portion is improved and thereby higher connection reliability can be attained.

The mounting structure of semiconductor chip according to a twenty-second aspect is characterized in that the semiconductor chip is bonded, in the face down manner, to the substrate for mounting semiconductor chip according to the twenty-first aspect from the surface opposing to the surface where a part of wire is projected to the aperture of the through-hole under the condition that the electrode and through-hole of the semiconductor chip are matched in the position, the wire projected to the aperture is bonded to the electrode of semiconductor chip, and the wire and electrode of semiconductor chip are electrically connected. According to this mounting structure of semiconductor chip, since the wire of connecting portion to the semiconductor chip is not fixed, the stress alleviating capability of wiring portion can be improved and thereby higher connection reliability can be attained.

The mounting structure of semiconductor chip according to a twenty-third aspect is characterized in that the semiconductor chip where a stud bump is formed to an electrode is bonded, in the face down manner, to the substrate for mounting semiconductor chip according to twenty-first aspect from the surface opposed to the surface where a part of the wire is projected to the aperture of the through-hole under the condition that the electrode and through-hole of the semiconductor chip are matched in the position, the wire projected to the aperture is bonded to the stud bump of the semiconductor chip, and thereby the wire and electrode of semiconductor chip are electrically connected. According to this mounting structure of semiconductor chip, since the wire of the connecting portion to the semiconductor chip is not fixed to the insulation base material, the stress alleviating capability of wiring portion can be improved and thereby higher connection reliability can be attained. Moreover, the wire projected to the aperture of the through-hole sticks to stud bump due to the plastic deformation of stud bump. Accordingly, more strong and stable connection can be obtained.

The mounting structure of the semiconductor chip according to a twenty-fourth aspect is characterized in that the semiconductor chip where a plated bump is formed to an electrode is bonded, in the face down manner, to the substrate for mounting a semiconductor chip according to a twenty-first aspect from the surface opposed to the surface where a part of wire is projected to the aperture of through-hole under the condition that the electrode and through-hole of the semiconductor chip are matched in the position, the wire projected to the aperture is bonded to the plated bump of semiconductor chip, and the wire and electrode of semiconductor chip are electrically connected. According to this mounting structure of semiconductor chip, since the wire of the connecting portion to the semiconductor chip is not fixed to the insulation base material, the stress alleviating capability of the wiring portion can be improved and thereby higher connection reliability can be attained. Moreover, since the plated bump can be formed simultaneously under the wafer condition, manufacturing cost can be lowered in comparison with that of the stud bump.

The mounting method of semiconductor chip according to a twenty-fifth aspect is characterized by comprising the first process for mounting, in the face down manner, through a bonding agent, the semiconductor chip to the surface opposing to the surface where a part of the wire is projected to the aperture of through-hole in the substrate for mounting a semiconductor chip according to the twenty-first aspect under the condition that the electrode and through-hole of the semiconductor chip are matched in the position, and the second process for bonding the wire projected to the aperture to the electrode of semiconductor chip using the bonding tool from the surface where a part of wire is projected to the aperture of through-hole in the substrate for mounting the semiconductor chip. According to this mounting method of semiconductor chip, since the wire of the connecting portion to the semiconductor chip is not fixed to the insulation base material, the stress alleviating capability of wiring portion can be improved and higher connection reliability can also be attained.

In the invention according to a twenty-sixth aspect, the insulation base material is formed of thermoplastic resin base material in the substrate for mounting semiconductor chip according to the fourteenth or twenty-first aspects. Moreover, in the twenty-seventh aspect, the substrate for mounting semiconductor chip according to the twenty-sixth aspect is used in the mounting structure of semiconductor chip according to the seventeenth, eighteenth, twenty-second, twenty-third, and twenty-fourth aspects. According to the twenty-sixth and twenty-seventh aspects, since the thermoplastic resin base material is used, the semiconductor chip can be bonded to the base material through the thermal compression bonding. Accordingly, the bonding agent is not required and the coating process of bonding agent (bonding agent supplying process) can be eliminated.

The mounting method of semiconductor chip according to the twenty-eight aspect is characterized by comprising the first process for thermal compression bonding of the semiconductor chip, in the face down manner, to the insulation base material formed of the thermoplastic resin base material on the surface opposing to the surface where a part of wire is projected to the aperture of through-hole in the substrate for mounting semiconductor chip according to the fourteenth aspect under the condition that the electrode and through-hole of the semiconductor chip are matched in the position, and the second process for inserting the bump into the through-hole and bonding the bump to the electrode of semiconductor chip from the surface where a part of wire is projected to the aperture of through-hole in the substrate for mounting semiconductor chip. According to this mounting method of semiconductor chip, since the wire of the connecting portion to the bump by the flip chip connection is not fixed to the insulation base material, the stress alleviating capability of wiring portion can be improved and higher connection reliability can be attained. Moreover, in the bump bonding process, mounting of bump to the electrode and connection between the bump and wire can be performed simultaneously and thereby the processes can be simplified. In addition, the semiconductor chip can be bonded to the base material through the thermal compression bonding by using the thermoplastic resin base material.

Accordingly, the bonding agent is no longer required and the coating process of bonding agent (bonding agent supply process) can be eliminated.

The mounting method of a semiconductor chip according to the twenty-ninth aspect is characterized by comprising the first step for the thermal compression bonding, in the face down manner, of the semiconductor chip to the insulation base material formed of the thermoplastic resin base material on the surface opposing to the surface where a part of wire is projected to the aperture of through-hole in the substrate for mounting semiconductor chip according to the twenty-first aspect, in which the insulation base material is formed of thermoplastic resin base material, under the condition that the electrode and through-hole of the semiconductor chip are matched in the position, and the second process for bonding the wire projected to the aperture to the electrode of semiconductor chip, using the bonding tool, from the surface where a part of the wire is projected to the aperture of the through-hole in the substrate for mounting semiconductor chip. According to this mounting method of a semiconductor chip, since the wire of the connecting portion to the semiconductor chip is not fixed to the insulation base material, the stress alleviating capability of the wiring portion can be improved and thereby higher connection reliability can be attained. Moreover, since the thermoplastic resin base material is used, the semiconductor chip can be bonded to the base material through the thermal compression bonding. In addition, the bonding agent is no longer required and the coating process of bonding agent (bonding agent supplying process) can be eliminated.

BRIEF DESCRIPTION OF THE DRAWINGS

The above and other objects, features and advantages of the present invention will become more apparent from the following detailed description made with reference to the accompanying drawings:

FIG. 1 is a diagram illustrating the cross-sectional view of a substrate for mounting a semiconductor chip before the mounting and the semiconductor chip in the first embodiment;

FIGS. 9A and 9B are cross-sectional views before and after the mounting in the second embodiment;

FIGS. 17A and 17B are cross-sectional views before and after the mounting of the semiconductor chip of the third embodiment;

FIGS. 20A to 20C are vertical cross-sectional views for explaining the flip chip mounting process;

FIGS. 21A and 21B are vertical cross-sectional views for explaining the flip chip mounting process in the fourth embodiment;

FIG. 22 is a vertical cross-sectional view illustrating the mounting structure of the other example of semiconductor chip;

FIGS. 23A and 23B are vertical cross-sectional views for explaining the flip chip mounting process in the fifth embodiment;

FIGS. 27A to 27C are vertical cross-sectional views for explaining the flip chip mounting process of the other example;

BRIEF DESCRIPTION OF THE PREFERRED EMBODIMENTS (First Embodiment)

The first embodiment embodying the present invention will be described below in accordance with the accompanying drawings.

In FIG. 1, a substrate 1 for mounting a semiconductor chip and a semiconductor chip 20 before the mounting in this first embodiment are illustrated. A mobile computer (electronic control apparatus) is constructed by the substrate 1 for mounting semiconductor chip, the semiconductor chip 20, and the like. The semiconductor chip 20 is provided with bumps (projected electrodes) 21.

Figure 2A:
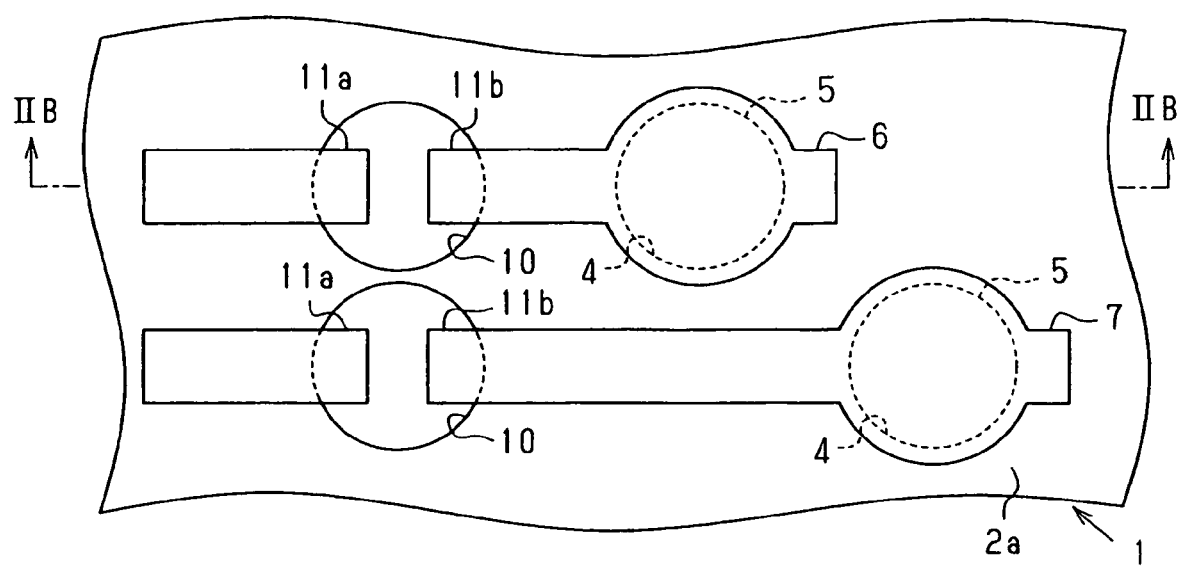
FIGS. 2A and 2B are partially enlarged views of the substrate for mounting the semiconductor chip.
Figure 2B:
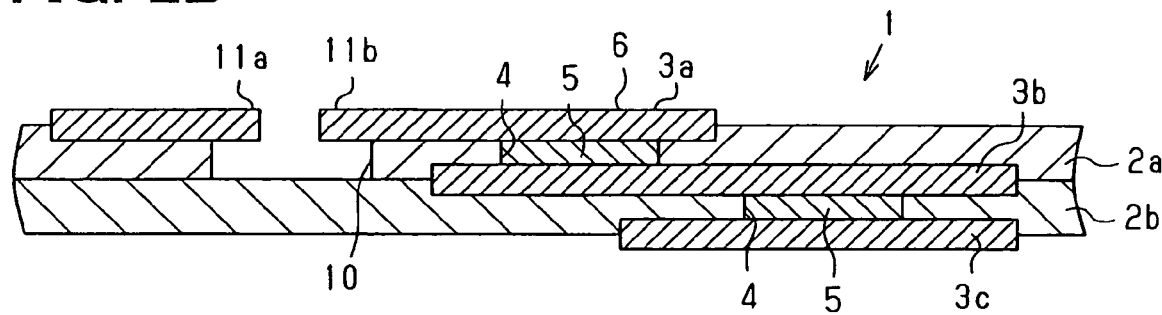

FIGS. 2A and 2B are partially enlarged views of the substrate 1 for mounting the semiconductor chip. FIG. 2A is a plan view of the substrate 1, while FIG. 2B is a cross-sectional view along the line IIB—IIB of FIG. 2A. In these FIGS. 2A and 2B, the substrate 1 for mounting the semiconductor chip is formed by alternately stacking the insulation layers (base materials) 2a, 2b, etc. and wiring layers 3a, 3b, 3c, etc. to the insulation layers (base materials) 2a, 2b, etc. Via-holes 4 for interlayer continuity are formed for electrically connecting the wire of each layer. The wire of each layer is electrically connected by the via-holes 4, more specifically, with the conductor 5 filling the via-hole 4.

Wires 6 and 7 are formed with the wiring layer 3a of the outermost surface layer and a through-hole (cavity) 10 is formed to the connecting position of the wires 6 and 7 in the insulation layer 2a of the outermost surface layer and semiconductor chip 20. The plane of the through-hole (cavity) 10 has the circular shape. The wires 6 and 7 are projected as the projected portions 11a, 11b at the upper surface of the through-hole (cavity) 10. Each through-hole (cavity) 10 may be individually allocated in each connecting point or a continuous through-hole may also be formed for a plurality of connecting points. The projected portions 11a, 11b of the wires 6 and 7 at the surface layer may be formed by edging (not illustrated) only one wire at the center of the connecting point as illustrated in FIGS. 2A and 2B.

As described above, the substrate 1 for mounting the semiconductor chip is formed as the multilayer substrate by alternately stacking the insulation layers 2a, 2b, etc. and wiring layers 3a, 3b, etc. The wires by each wiring layer 3a, 3b, 3c are electrically connected by a via-hole 4 for interlayer continuity and the semiconductor chip 20 in FIG. 1 is flip chip mounted. Moreover, over the insulation layer 2a of the outermost surface layer, the through-hole 10 is formed to insert the bump 21 to the allocating position of bump 21 of the semiconductor chip 20 and a part of the wires 6 and 7 in the wiring layer 3a of the outermost surface layer is projected to the inside of through-hole 10 at the aperture of through-hole 10.

Next, the processes for flip chip mounting the semiconductor chip 20 of FIG. 1 will be described using the substrate 1 for mounting semiconductor chip of FIGS. 2A and 2B.

Figure 3:
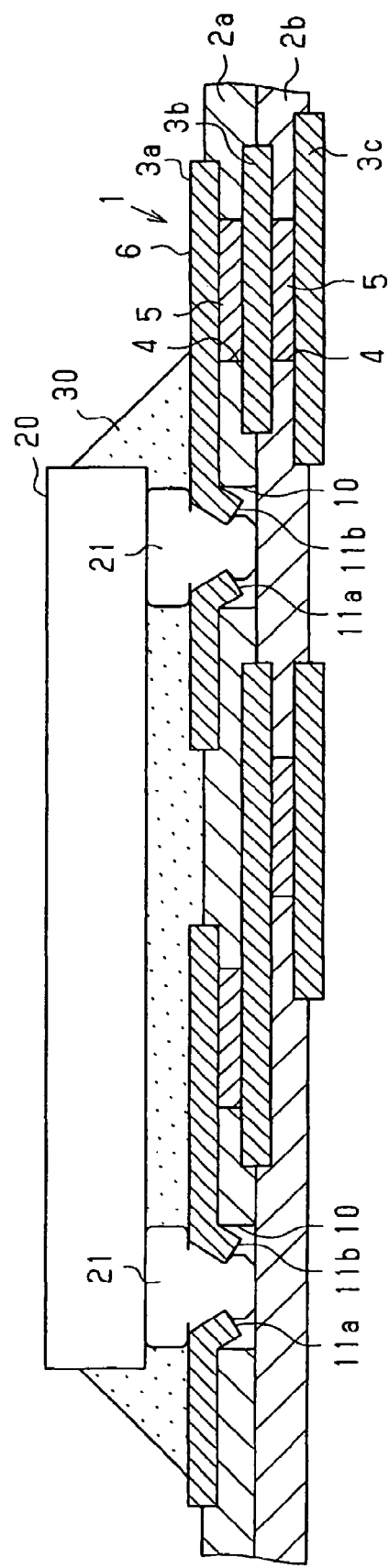
FIG. 3 is a diagram illustrating the cross-sectional view after the mounting.

As illustrated in FIG. 1, the semiconductor chip 20 provided with the bump 21 is positioned to the substrate 1 for mounting a semiconductor chip through the bump 21 and through-hole (cavity) 10. Under this condition, while at least heat and pressure are applied, the bump 21 is inserted into the through-hole 10 for the flip chip connection as illustrated in FIG. 3. In this case, since the bump 21 is inserted into the through-hole 10, the projected portions 11a and 11b of the wire are deformed and these projected portions 11a and 11b are electrically connected to the bump 21. In more detail, when the bump 21 is inserted into the through-hole 10, the projected portions of wires 11a and 11b are deformed with the bump 21 and thereby the side surface of bump 21 is connected to the projected portions 11a and 11b of wires. When the bump is inserted, the bump 21 and projected portions 11a and 11b of wires are rubbed with each other to remove the oxide films and form newly generated surfaces. Accordingly, a metal coupling of the wire 6 and bump 21 can be formed.

During this flip chip mounting, it is preferable to set the heating temperature to about 50° C. to 200° C. in order to ensure the metal coupling. Moreover, the semiconductor chip 20 has been loaded to the substrate 1 in the mounting process described above while heat and pressure are applied. Moreover, the ultrasonic wave vibration may be applied during the flip chip mounting. As the mounting method of semiconductor chip, as described above, the semiconductor chip 20 provided with the bump 21 is flip chip connected to the substrate 1 for mounting the semiconductor chip by electrically connecting the deformed wire 6 and bump 21 while the bump 21 is inserted to the through-hole 10 during application of ultrasonic wave vibration to form the metal coupling in the connecting portion between the bump and wire under the condition that the bump 21 and through-hole 10 are matched in the position. Accordingly, since the surfaces of the bump and wire are sharpened due to the ultrasonic wave vibration and the newly generated surfaces are placed in contact, the metal coupling of bump and wire is surely formed. Thereby, connection strength can be improved and reliability of flip chip connection can further be improved (connection reliability becomes higher). In more detail, generation of new surfaces due to the sharpening of the surfaces of bump and wire can be accelerated stably, a metal coupling between the bump and wire is surely formed, and connection strength can also be improved. Moreover, as the bump 21, it is recommended to use a gold stud bump which has been formed by welding a gold ball formed by discharge of gold wire to the electrode of semiconductor chip using the ultrasonic wave vibration, heat and pressure. Namely, the gold stud bump is suitable because it is high and soft and enters the through-hole 10 resulting in the plastic deformation. In addition, since a gold-plated film is formed over the wire surface, the gold-to-gold bonding can be attained making easier the coupling.

Subsequently, as shown in FIG. 3, the under-fill material 30 is implanted to the gap between the substrate 1 and semiconductor chip 20. In this case, the thermal expansion coefficient of each material is, for example, as follows. Namely, the semiconductor chip (silicon chip) 20 shows 3 to 4 ppm/° C., substrate 1 shows 17 ppm/° C., and under-fill material 30 shows 20 to 30 ppm/° C.

As described above, the through-hole 10 is formed, to the substrate 1 for mounting the semiconductor chip 20, to insert the bump 21 through at least the insulation layer 2a of the outermost surface layer in the allocating position of the bump 21 of the semiconductor chip 20 to be mounted in at least the insulation layer 2a of the outermost surface layer. Moreover, a part of wire 6 in the wiring layer 3a of the outermost surface layer is projected in the internal side of through-hole 10 at the aperture of the through-hole 10. Therefore, according to this substrate 1 for mounting the semiconductor chip, since the wire of connecting portion to the bump 21 by such flip chip mounting is not fixed to the insulation layer (base material) 2a, the stress alleviating capability of wiring portion can be improved remarkably and the higher connection reliability can also be attained.

Moreover, in the mounting structure (FIG. 3) of the semiconductor chip obtained, the semiconductor chip 20 provided with the bump 21 is flip chip connected to the substrate 1 for mounting the semiconductor chip under the condition that the bump 21 and through-hole 10 are matched in the position and the wire 6 which is deformed because the bump 21 is inserted to the through-hole 10 is electrically connected to the bump 21. According to this mounting structure of the semiconductor chip, the wire is deformed with the bump 21 when the bump is inserted into the through-hole 10 and is connected to the side surface of the bump 21. In this case, since the wires 6 and 7 of connecting portion to the bump 21 are not fixed to the insulation layer (base material) 2a, the stress alleviating capability can be given to the wiring portion, and reliability of flip chip connection can be improved distinctively (the stress alleviating capability of wiring portion can be improved remarkably and higher connection reliability can be attained.)

Figure 4A:
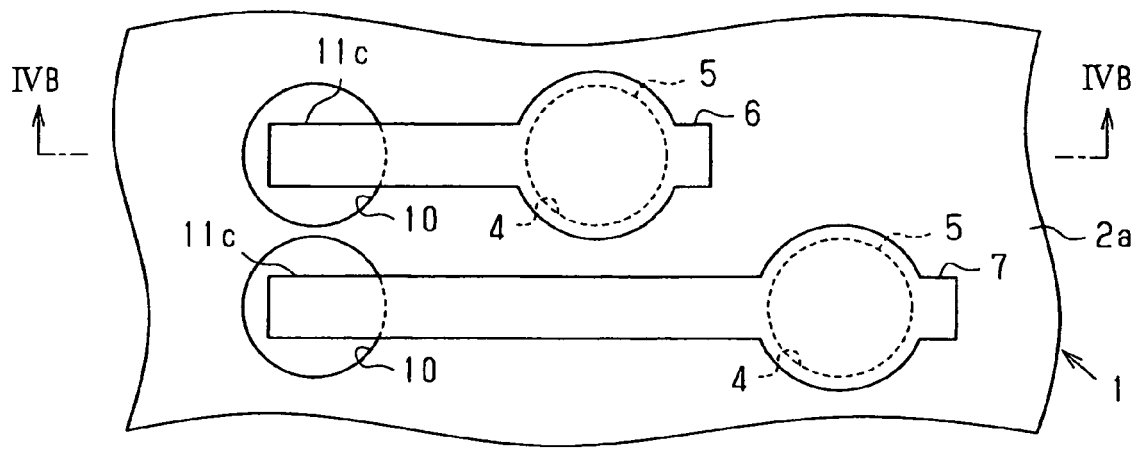
FIGS. 4A and 4B are partially enlarged views of the other examples of the substrate for mounting semiconductor chip.
Figure 4B:
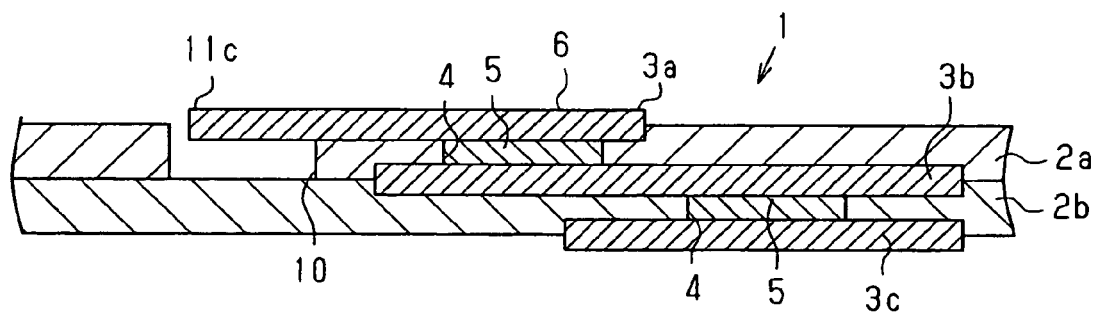

As the alternative structure of FIGS. 2A and 2B, it is also possible that the end portions of wires 6 and 7 are projected at the upper surface of the through-hole (cavity) 10 by placing these end portions to the upper end aperture of the through-hole (cavity) 10 as illustrated in FIGS. 4A and 4B.

Namely, the end portions 11c of the wires 6 and 7 may be projected within the though-hole 10.

Figure 5:
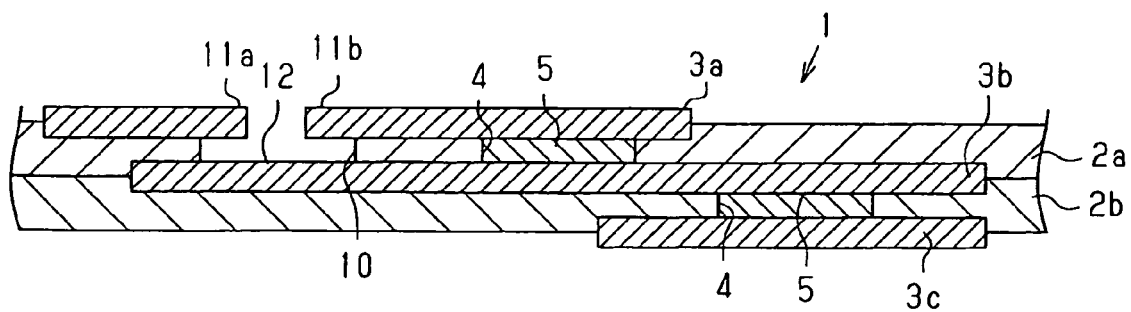
FIG. 5 is a partially enlarged cross-sectional view of the other example of the substrate for mounting semiconductor chip.

As the alternative structure of FIGS. 2A and 2B, the wire 12 may be provided, as illustrated in FIG. 5, for the flip chip connection to the bottom part of through-hole 10. In this case, since the wire 12 is also provided at the bottom surface of through-hole 10, the bump 21 can be connected to the wire 12 at the bottom surface of through-hole 10. Accordingly, connection reliability can be improved by increasing the connection area between the bump and wire.

Figure 6:
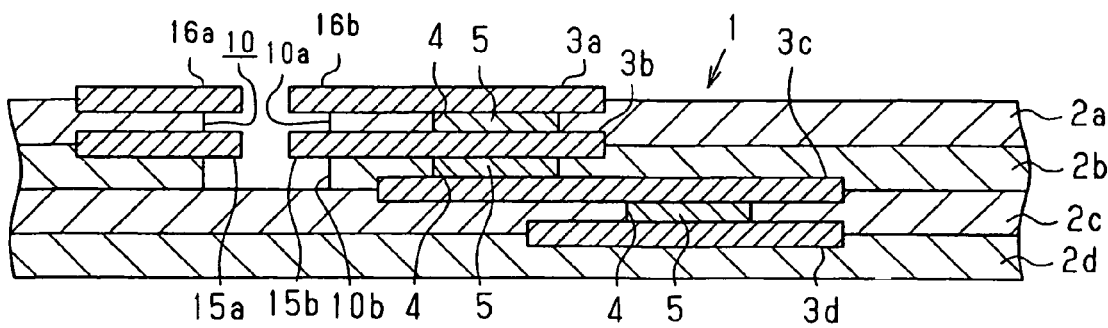
FIG. 6 is a partially enlarged cross-sectional view of the other example of the substrate for mounting the semiconductor chip.
Figure 7:
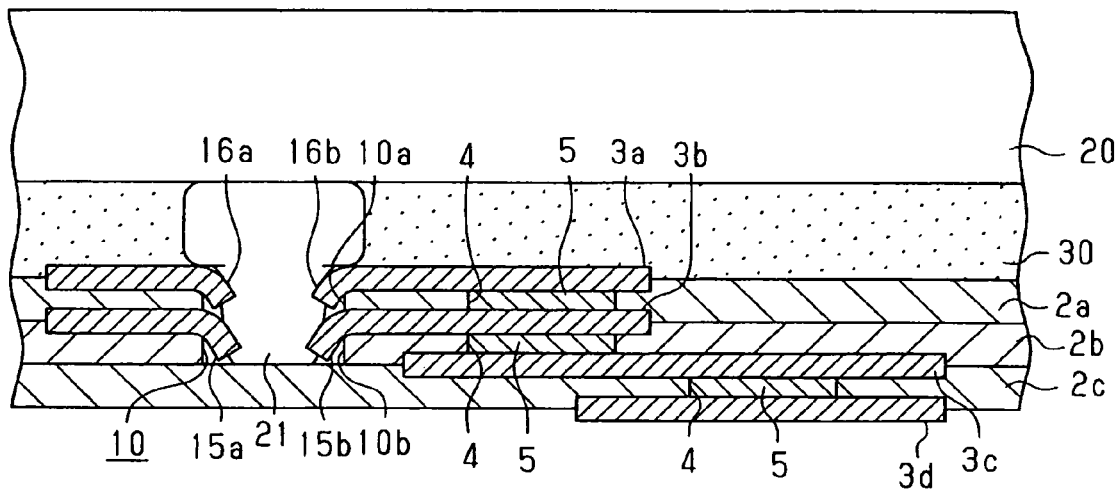
FIG. 7 is a cross-sectional view of the other example after the mounting.

In addition, as the alternative structure of FIGS. 2A and 2B, the through-hole 10 may be provided through two layers from the surface layer. In more detail, the through-hole (cavity) 10a at the insulation layer 2a of the outermost surface layer and the through-hole (cavity) 10b at the insulation layer 2b under the insulation layer 2a are constructed continuously. The wire (3b) of the internal layer is projected into the through-hole 10 like the surface layer wire (3a). Namely, the through-hole 10 provided through at least the insulation layer 2a of the outermost surface layer is also provided through the insulation layer 2b on the internal layer side as well as the insulation layer 2a of the outermost surface layer and a part of wiring by the wiring layer 3b on the internal layer side as well as the wiring layer 3a of the outermost surface layer is projected into the through-hole 10 from the side wall of the through-hole 10. In this case, as illustrated in FIG. 7, since the wire is projected also from the side wall of through-hole 10 (internal layer in the through-hole 10), the connection area at the side wall of the bump 21 can be increased (connection points with the bump can be increased) and thereby higher connection reliability can be attained. Here, the substrate structure can also be adapted to the case where the wire 12 is provided at the bottom part of the through-hole 10 as in FIG. 5. Moreover, regarding the projection of the wire from the internal layer, the wires of two or more layers may be projected in addition to the case of FIG. 6.

Figure 8:
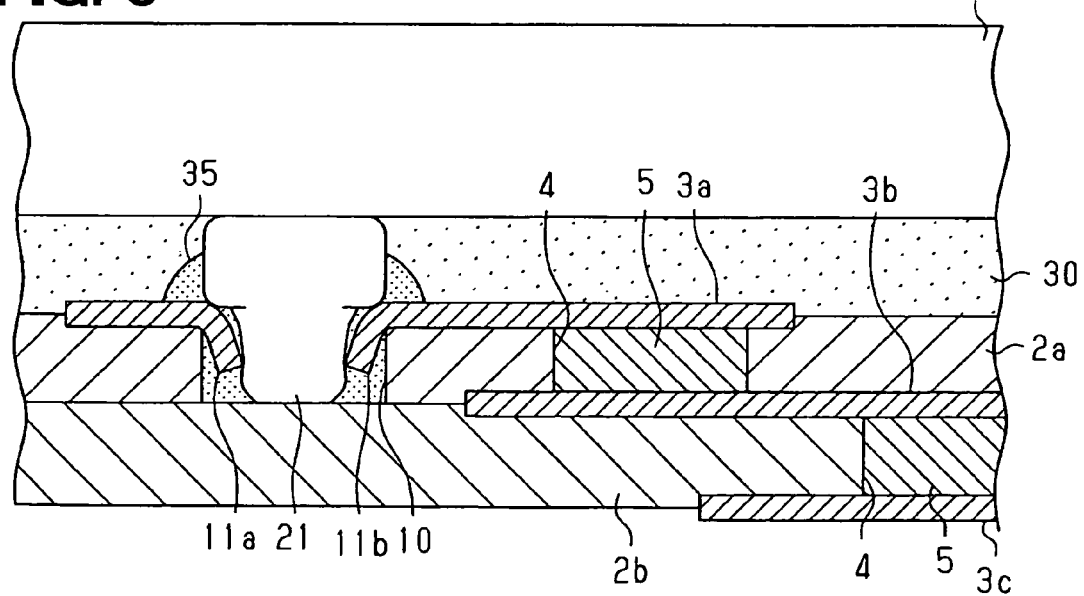
FIG. 8 is a cross-sectional view of the other example after the mounting.

Moreover, as an alternative to the structure of FIG. 3, the through-hole 10 may be filled with silver paste 35 in order to fill the connecting portion of the bump 21 and the projected portions 11a and 11b of wire with the silver paste 35 as illustrated in FIG. 8. Since the connecting portion of the bump 21 and wire in the through-hole 10 is filled with the silver paste 35 as described above, connection resistance can be lowered and the connection between the bump 21 and projected portions 11a and 11b of wire can be reinforced. In addition, even if direct connection of the bump 21 and projected portions 11a, 11b of wire is broken, since the electrical connection can be maintained directly be the silver paste 35, connection failure is not generated and higher connection reliability can be attained.

(Second Embodiment)

Next, the second embodiment will be described with reference to the accompanying drawings.

FIGS. 9A and 9B illustrate the substrate 50 for mounting the semiconductor chip 20 and the semiconductor chip 20 itself in this embodiment. FIG. 9A illustrates the condition before the mounting and FIG. 9B illustrates the condition after the mounting.

Figure 10A:
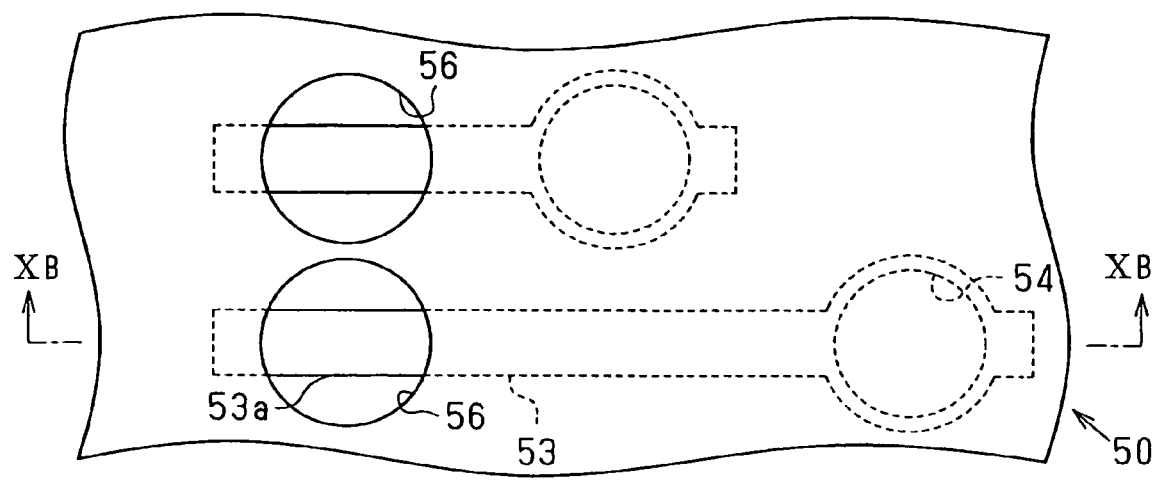
FIGS. 10A and 10B are partially enlarged views of the substrate for mounting semiconductor chip.
Figure 10B:
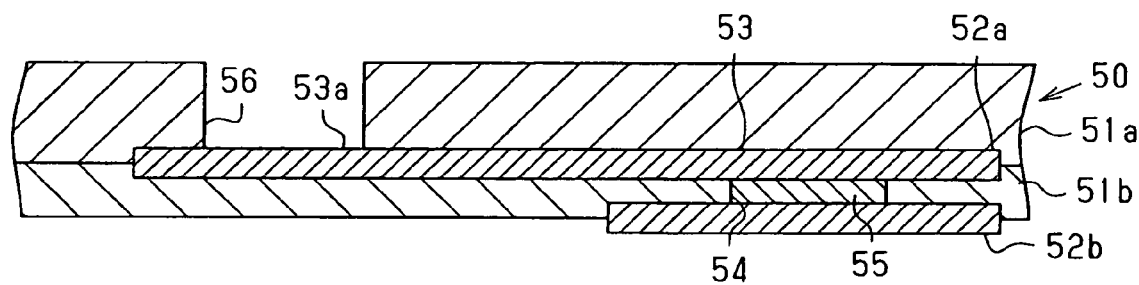

FIGS. 10A and 10B are partially enlarged diagrams of the substrate 50 for mounting semiconductor chip, in which FIG. 10A is a plan view of the substrate 50 and FIG. 10B is a cross-sectional view along the line XB—XB in FIG. 10A. In FIGS. 10A and 10B, the substrate 50 for mounting the semiconductor chip is formed by alternately stacking the insulation layers (base materials) 51a, 51b, etc. and wiring layers 52a, 52b, etc. The insulation layers (base materials) 51a, 51b, etc. are also provided with via-holes 54 for interlayer continuity to electrically connect the wiring of each layer. The wire of each layer is electrically connected through the via-hole 54 by the conductor 55 filling the via-hole 54.

Moreover, the insulation layer 51a of the outermost surface layer is formed of thermoplastic resin and the through-hole (cavity) 56 is formed at the connecting position with the semiconductor chip 20. At the bottom part of the though-hole 56, a part of wire 53 is exposed. Each through-hole (cavity) 56 may be allocated individually in each connecting point or a continuous through-hole (cavity) may be formed for a plurality of connecting points.

As described above, the substrate 50 for mounting the semiconductor chip is a multilayer substrate formed by alternately stacking the insulation layers 51a, 51b, etc. and the wiring layers 52a, 52b, etc. The wires of wiring layers 52a, 52b are electrically connected with the via-hole 54 for interlayer continuity and the semiconductor chip 20 illustrated in FIG. 9A is flip chip mounted. Moreover, the through-hole 56 is formed so that the bump 21 may be inserted through at least the insulation layer 51a at the outermost surface layer 51a to the allocating position of the bump 21. Moreover, the wire 53 is provided at the bottom part of the through-hole 56 for connection with the bump 21 and at least the insulation layer 51a of the outermost surface layer is formed of thermoplastic resin.

In this case, the preferable conditions for the flip chip connection in order to simultaneously completing the sealing by the thermoplastic resin are as follows. Namely, temperature is 250° C. to 350° C., applied pressure is 3 to 5 kgf/cm$^2$ (3×9.8 to 5×9.8 newton/cm$^2$), and the preferable pressure application and heating time is 10 seconds.

Accordingly, the connecting portion and active surface of semiconductor chip can be sealed simultaneously with connection of bump and thereby flip chip connection process can be simplified remarkably. In addition, since the underfill material is no longer required and the thermal expansion coefficient is approximated to that of the material on the substrate side, higher reliability can be attained.

As described above, the active surface of the semiconductor chip 20 can be placed in contact with the surface layer of the substrate 50 by accommodating the bump 21 within the through-hole 56 and connecting it to the bump 21 at the bottom part thereof. Moreover, the connecting portion and the active surface of semiconductor chip 20 can be sealed simultaneously with connection of the bump 21 with the heat and applied pressure at the time of flip chip connection by forming the surface layer of substrate 50 with the thermoplastic resin. As described above, stress of the connecting portion depending on difference of thermal expansion coefficients of the chip 20 and substrate 50 can be alleviated and higher connection reliability can be attained by using the insulation layer 51a of the outermost surface layer of the substrate as the under-fill material. Moreover, the flip chip connection process can be distinctively simplified.

That is, as the mounting structure of semiconductor chip, the semiconductor chip 20 provided with the bump 21 is flip chip connected to the substrate 50 under the condition that the bump 21 and through-hole 56 are matched in the position. Moreover, since the bump 21 is inserted into the through-hole 56, the wire and bump 21 are electrically connected under the condition that the active surface of the semiconductor chip 20 is bonded to the substrate 50 for mounting the semiconductor chip 20 with the the thermoplastic resin insulation layer 51*a* of the outermost surface layer of the substrate 50. According to this mounting structure, when the bump 21 is inserted into the through-hole 56, it is connected to the wire. Moreover, the insulation layer 51*a* of the outermost surface layer of the substrate 50 is used as the under-fill material and the higher connection reliability can be attained as described above.

As the alternative structure of FIGS. 10A and 10B, the through-hole 56 may be formed, at the connecting position with the semiconductor chip, through the insulation layer 51*b* under the insulation layer 51*a* of the outermost surface layer (thermoplastic resin layer) in addition to the insulation layer 51*a*. In more detail, the through-hole (cavity) 56*a* of the insulation layer 51*a* of the outermost surface layer is continued, as the structure, to the through-hole (cavity) 56*b* at the insulation layer 51*b* under the layer 51*a*. The through-hole 56 is provided through two layers as described above and the wire 59 of the internal layer is projected into the through-hole 56.

Figure 11A:
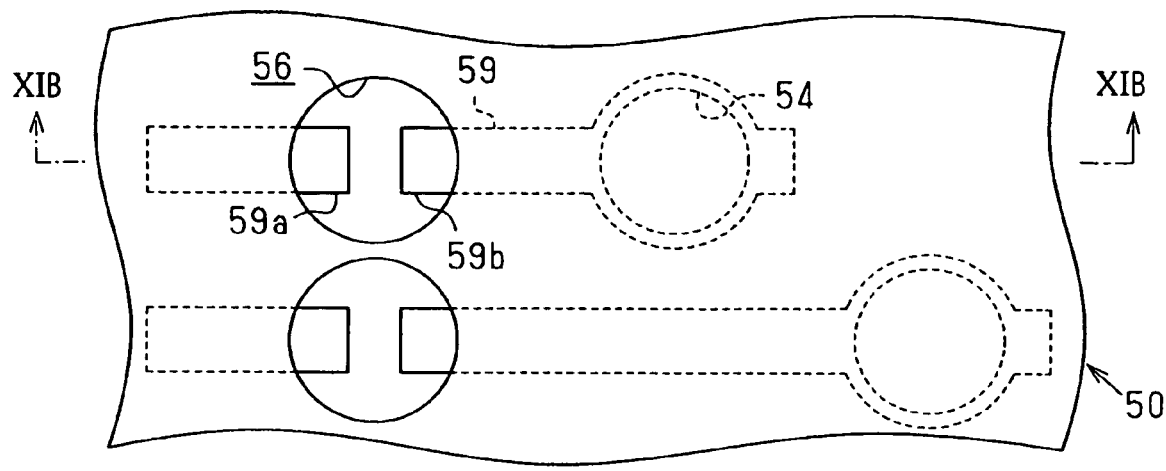
FIGS. 11A and 11B are partially enlarged views of the other example of the substrate for mounting semiconductor chip.
Figure 11B:
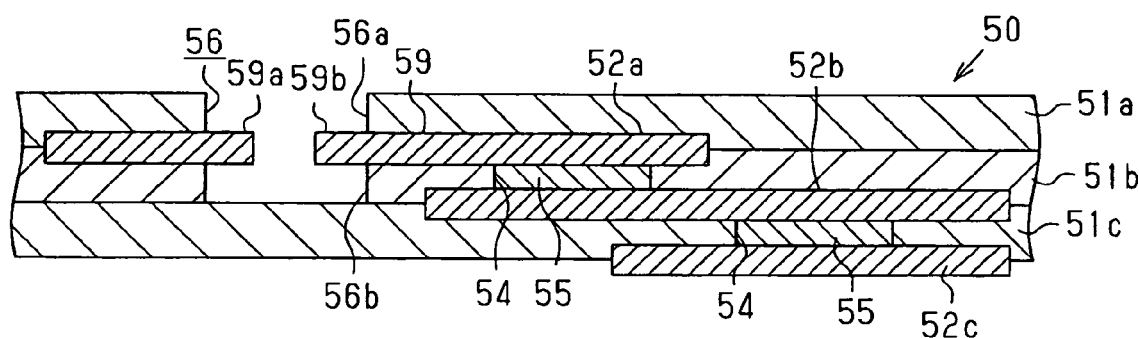

The projected portions 59*a* and 59*b* of wires from the internal layer may also be formed by projecting the wires of two or more layers in addition to that illustrated in FIGS. 11A and 11B. In wider meaning, the through-hole 56 provided through the insulation layers 51*a* and 51*b* of two layers including at least the insulation layer 51*a* of the outermost surface layer is formed to insert the bump 21 in the substrate at the allocating position of the bump 21 of the semiconductor chip 20. Moreover, a part of the wire by the wiring layer 52*a* sandwiched by the insulation layers 51*a* and 51*b* is projected into the through-hole 56. In addition, at least the insulation layer 51*a* of the outermost surface layer is formed of the the thermoplastic resin. Accordingly, since the wire of the connecting portion to the bump 21 by the flip chip connection is not fixed to the insulation layers (base materials) 51*a* and 51*b*, the stress alleviation capability of wiring portion can be improved distinctively. Moreover, since the surface layer of the substrate 50 is formed with the thermoplastic resin, the connecting portion and active surface of the semiconductor chip 20 can be sealed simultaneously with connection of the bump 21 with the heat and pressured applied during the flip chip mounting. As described above, stress at the connecting portion due to the difference in the thermal expansion coefficients of the chip 20 and substrate 50 can be alleviated and higher connection reliability can be attained by using the insulation layer 51*a* of the outermost surface layer of substrate as the under-fill material. Moreover, the flip chip connection process can be simplified remarkably.

Figure 12:
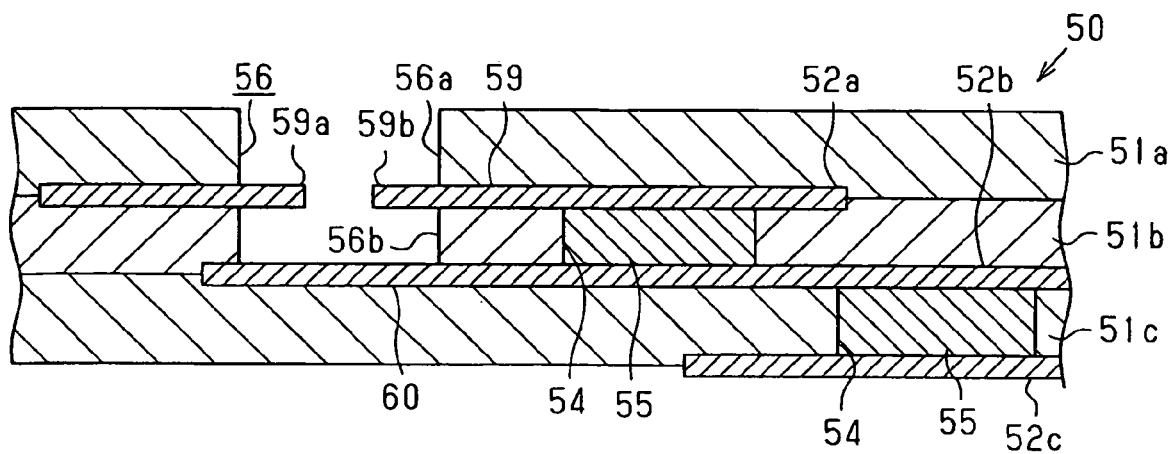
FIG. 12 is a partially enlarged cross-sectional view of the other example of the substrate for mounting semiconductor chip.

Referring to FIG. 12, it is also possible to provide a wire 60 for the flip chip connection at the bottom part of the through-hole 56 in alternative to the structure illustrated in FIGS. 11A and 11B. As described above, the wire can be connected to the bump 21 at the bottom surface of the through-hole and thereby the connecting area of the bump 21 and wire can be increased and connection reliability can be improved. In FIGS. 11A, 11B, and FIG. 12, for the projected portion of the internal layer wire 59, only one wire is edged (not illustrated) at the center of the connecting point as illustrated in FIGS. 11A and 11B.

Figure 13:
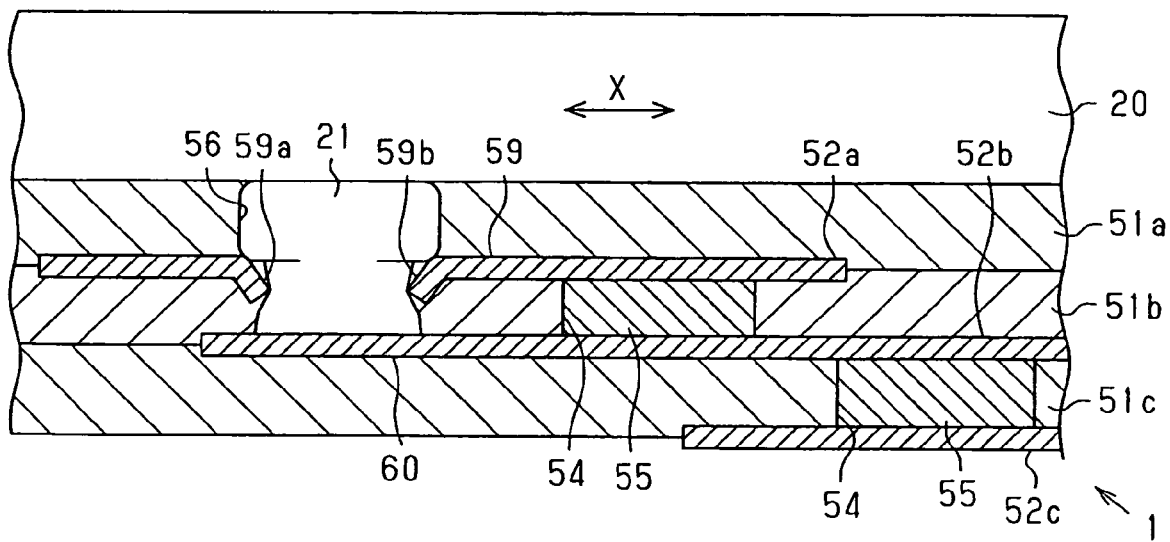
FIG. 13 is a cross-sectional view after the mounting of the other example.

For the mounting to the substrate 50 of FIG. 12, the bump 21 is inserted into the through-hole 56 as illustrated in FIG. 13 and is electrically connected to the wire 60 at the bottom part of the through-hole 56. In addition, the bump 21 is electrically connected to the wires 59 (59*a* and 59*b*) which have been deformed because the bump 21 is inserted into the through-hole 56. The active surface of the semiconductor chip 20 and connecting portion are sealed simultaneously with the flip chip connection with the insulation layer of the outermost surface layer (thermoplastic resin layer) 51*a*.

According to this connecting structure, the bonding area of the bump 21 increases because the bonding area of the wire 60 is added to the bonding area of the wires 59 (59*a* and 59*b*). In addition, a thermal stress is likely added to the bonding area between the bump 21 and wire 60 because it operates in the X direction in FIG. 13 (the shearing stress is easily applied), but since the wires 59 (59*a* and 59*b*) are also bonded to the bump 21, reliability can be improved. Namely, since the connecting portion to the bump 21 in the internal wire 59 is not fixed to the insulation layers (base materials) 51*a* and 51*b*, the stress alleviating capability of the wiring portion can be improved remarkably. In addition, the bump 21 is connected to the wire 60 even at the bottom part of the through-hole 56, the connecting area of bump 21 and wire can be increased, and thereby higher flip chip connection reliability can be improved.

As the mounting method of the semiconductor chip, the semiconductor chip 20 provided with the bump 21 is mounted to the substrate 50 under the condition that the bump 21 and through-hole 56 are matched in the position and the bump 21 on the side of chip 20 and the wire on the side of substrate 50 are electrically connected while the active surface of semiconductor chip 20 and the substrate 50 are bonded with the thermoplastic resin insulation layer 51*a* of the outermost surface layer of the substrate 50 by inserting the bump 21 into the through-hole 56 by applying at least heat and pressure. Accordingly, the active surface of semiconductor chip 20 can be placed in contact with the surface layer of substrate 50 by accommodating the bump 21 into the through-hole 56 for connection with the bump 21. In this case, the connecting portion and active surface of the semiconductor chip 20 can be sealed simultaneously with the bump 21 through application of heat and pressure during the flip-flop mounting by forming the surface layer of the substrate 50 with the thermoplastic resin. Moreover, higher connection reliability can also be attained by using the insulation layer 51*a* of the outermost surface layer of the substrate as the under-fill material. In addition, the flip chip connection process can be simplified distinctively.

Moreover, generation of new surfaces due to sharpening of the surfaces of bump 21 and wires 59 (59*a* and 59*b*) can be accelerated stably with application of ultrasonic wave vibration during the flip chip connection and accordingly a metal coupling is surely formed between the bump 21 and wires 59 (59*a* and 59*b*) and connection strength can also be improved. In this case, since the active surface of the semiconductor chip 20 is likely to be damaged if the ultrasonic wave vibration is applied while the semiconductor chip 20 is in contact with the surface layer of the substrate 50, the ultrasonic wave vibration is applied, even in the case of longest period, during the period from the contact between the bump 21 and bottom portion of the through-hole until the active surface of semiconductor chip 20 is in contact with the surface layer of substrate. Namely, a metal coupling is formed in the connecting portion of the bump 21 and wire, when heat and pressure are applied, by applying the ultrasonic wave vibration, even in the case of the longest period, during the period from the contact between the bump 21 and the bottom part of through-hole 56 until the active surface of semiconductor chip 20 is in contact with the insulation layer 51*a* of the outermost surface layer of the substrate 50 for mounting the semiconductor chip 50. Accordingly, since the new surfaces are placed in contact because the surfaces of the bump 21 and the wire are sharpened with the ultrasonic wave vibration, the metal coupling can surely be formed by the bump 21 and the wire and the connection strength can be improved. Therefore, the flip chip connection reliability can further be improved. Moreover, the active layer of the semiconductor chip 20 can be freed from damage, simultaneous sealing can be realized with the thermoplastic resin at the surface layer, and the processes can be simplified by applying only heat and pressure without application of ultrasonic wave vibration in the stage where the active surface of the semiconductor chip 20 is in contact with the surface of substrate.

Figure 14A:
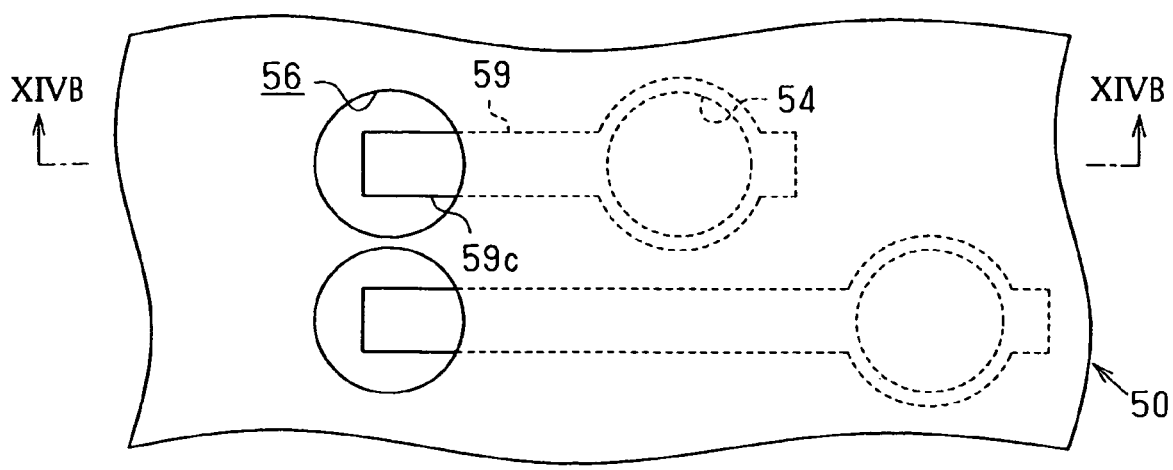
FIGS. 14A and 14B are partially enlarged views of the other example of the substrate for mounting semiconductor chip.
Figure 14B:
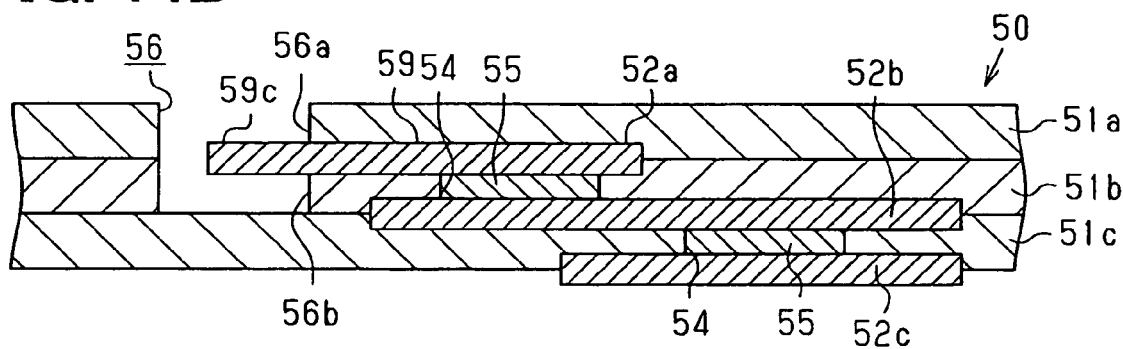

Regarding projection of wires 59 of internal layer in FIGS. 11A, 11B and FIG. 12, only one wire is edged (not illustrate) at the center of the connecting point as illustrated in FIGS. 11A and 11B. Otherwise, it is also possible to bring the end part of the wire 59 into the through-hole 56 as illustrated in FIGS. 14A and 14B. Namely, the end part 59c of wire 59 may be projected into the through-hole 56.

Figure 15:
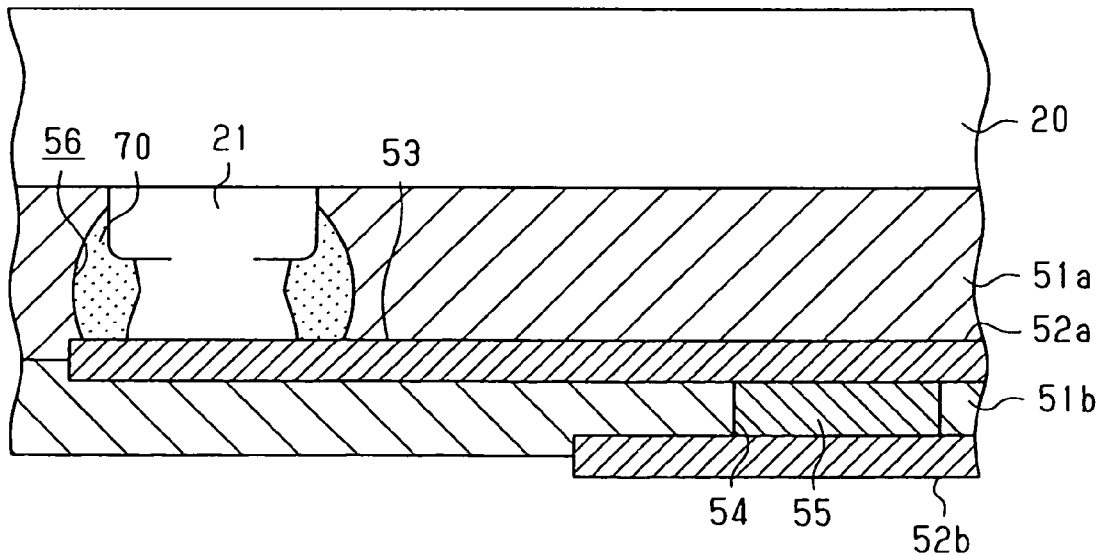
FIG. 15 is a cross-sectional view after the mounting of the other example.

Moreover, as the alternative structure of FIG. 9B, the through-hole 56 is filled with the silver paste 70 and the connecting portion of the bump 21 and wire 53 is filled with the silver paste 70 as illustrated in FIG. 15. Since the connecting portion of the bump 21 and wire is filled with the silver paste 70 within the through-hole 56, connection resistance can be lowered and connection between the bump 21 and wire 53 can also be reinforced. Moreover, even if the direct connection of bump 21 and wire 53 is broken, since the indirect electrical connection is maintained with the silver paste 70, connection failure does not occur and higher connection reliability can be attained.

As the substrates 1 and 50 for mounting the semiconductor chip 20, a laminated substrate is used in which a plurality of thermoplastic resin base material layers, to which the surface layer wire and via-hole for interlayer continuity are formed, are laminated and thermally pressed simultaneously.

Figure 16:
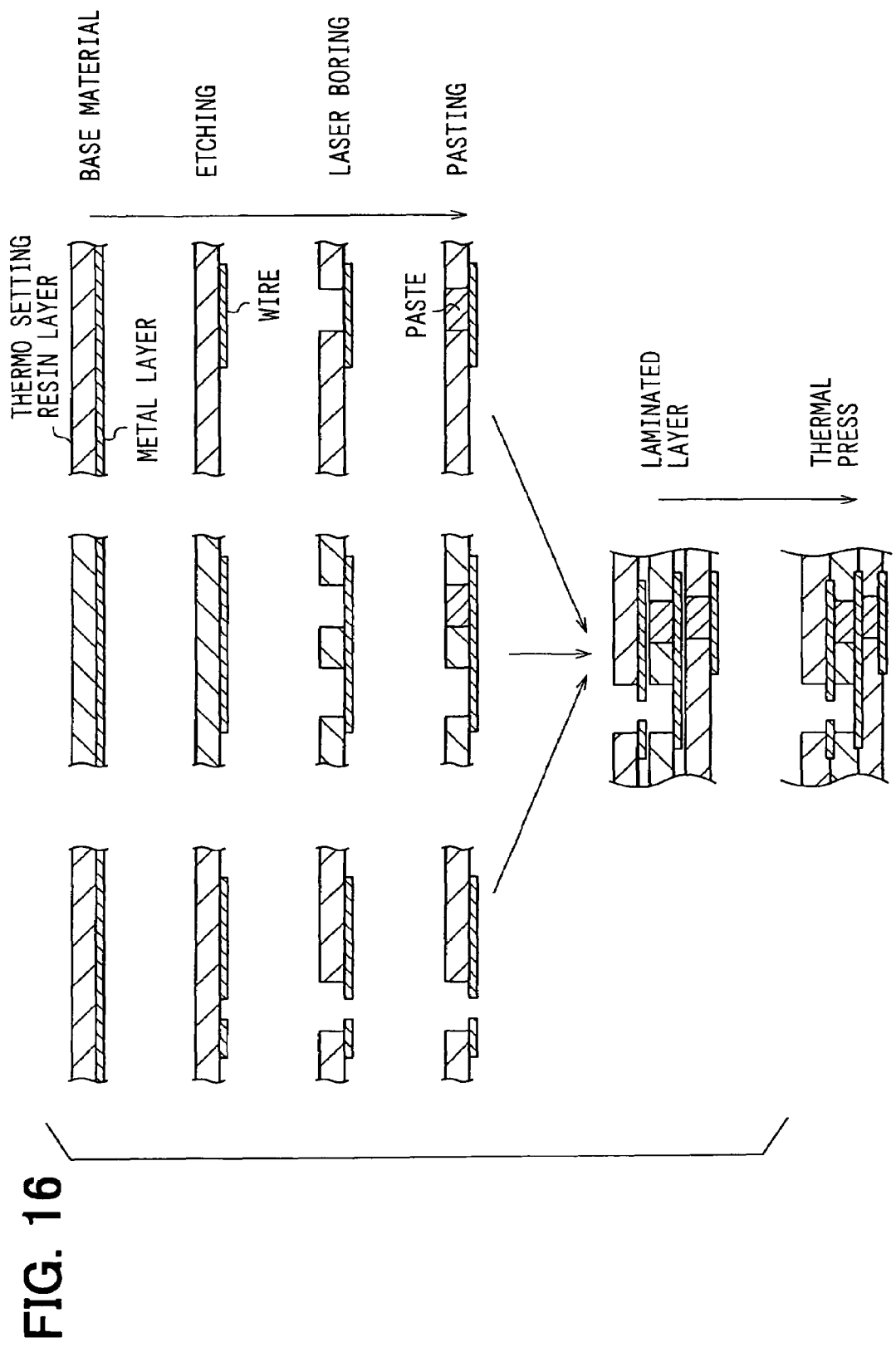
FIG. 16 is a diagram illustrating the process flow of substrate in the embodiments.

Detail process flow of thermoplastic resin laminated substrate is illustrated in FIG. 16. Wires are formed by the etching process. Moreover, a hole is bored with the laser or the like only to the resin portion of the via-hole for interlayer continuity. Next, the hole is filled with the metal paste. Each layer formed with such process is simultaneously stacked and thermally pressed simultaneously. As described above, a laminated layer substrate has been formed.

Figure 29:
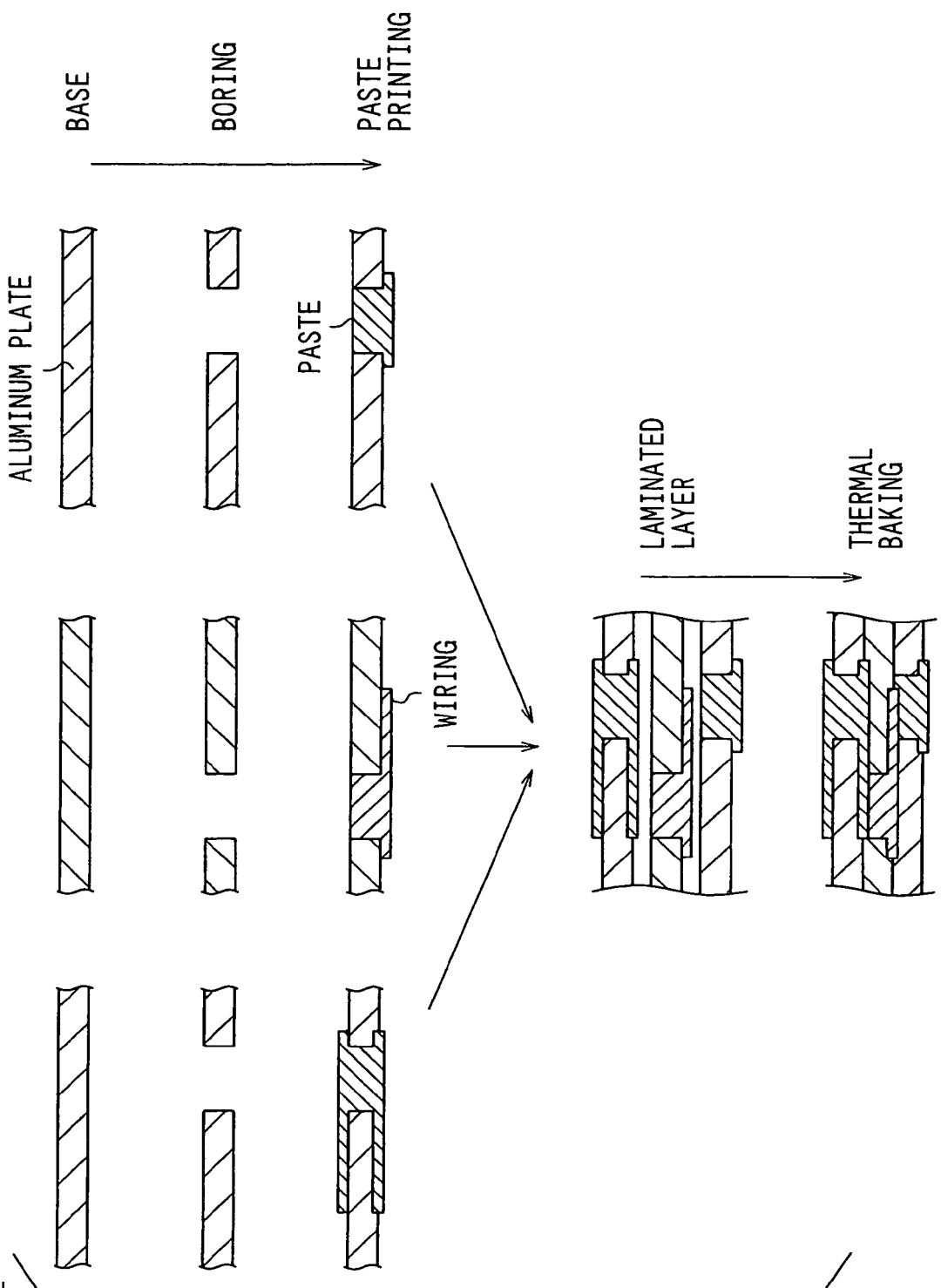
FIG. 29 is a diagram illustrating the process flow of a related art ceramics multilayer substrate.

The process flow of a related art ceramic multilayer substrate of FIG. 29 will be discussed for comparison. In FIG. 29, a base material including alumina of 90% or more is prepared and a hole is bored to the via-hole portion for continuity of the base material. A wire is formed by printing the metal paste and the hole is filled with the metal paste. In addition, each layer is simultaneously baked through the simultaneous stacking of layer. Accordingly, a laminated substrate can be formed.

In such comparison between FIG. 16 and FIG. 29, a patterned wiring layer is formed and a via-hole for interlayer continuity is formed in one surface of the thermoplastic resin insulation layer in FIG. 16. A plurality of base materials is stacked and thermally pressed simultaneously. Therefore, the laminated substrate has the following merits. With the method of forming the ceramics multilayer substrate illustrated in FIG. 29, the projected portion of wires cannot be formed over the above surface or within the through-holes in FIGS. 2A, 2B and FIG. 6. On the other hand, in the thermoplastic resin laminated substrate illustrated in FIG. 16, the projected portion of wire can be formed with the ordinary process at the upper surface or within the through-hole in FIGS. 2A, 2B, and FIG. 6.

Moreover, in the laminated substrate, wires must be formed to the front and rear surfaces of any one of the outermost surface layers of the front and rear sides and process is different from that of the other layer. However, in the substrate of FIGS. 10A, 10B and FIGS. 11A, 11B, the flip chip surface can be manufactured with the identical process for all layers because the wiring is not required. Accordingly, the manufacturing cost can be lowered.

As described above, even in the structure that wires are projected into the through-hole (via-hole) by using the simultaneously laminated substrate of the thermoplastic resin base material, the substrate can be manufactured in the process which is identical to that when the through-hole is not formed. Moreover, the substrate manufactured has an excellent recycling property because all layers are formed with the thermoplastic resin. In addition, an individual via-hole is used for interlayer continuity of each layer, high density wiring can be formed, and reduction in size of substrate can additionally be realized.

That is, in regard to the flip chip connection of the semiconductor chip via the bump, the through-holes are provided to the substrate, the wires for connection with the electrodes of semiconductor chip are projected at the upper surface of the through-holes, the substrate wires to be connected with the semiconductor chip are not fixed to the substrate because these wires are projected. Accordingly, the connection reliability in the flip chip connection can be improved by alleviating the stress.

(Third Embodiment)

Next, the third embodiment will be described with reference to the accompanying drawings.

Figure 18A:
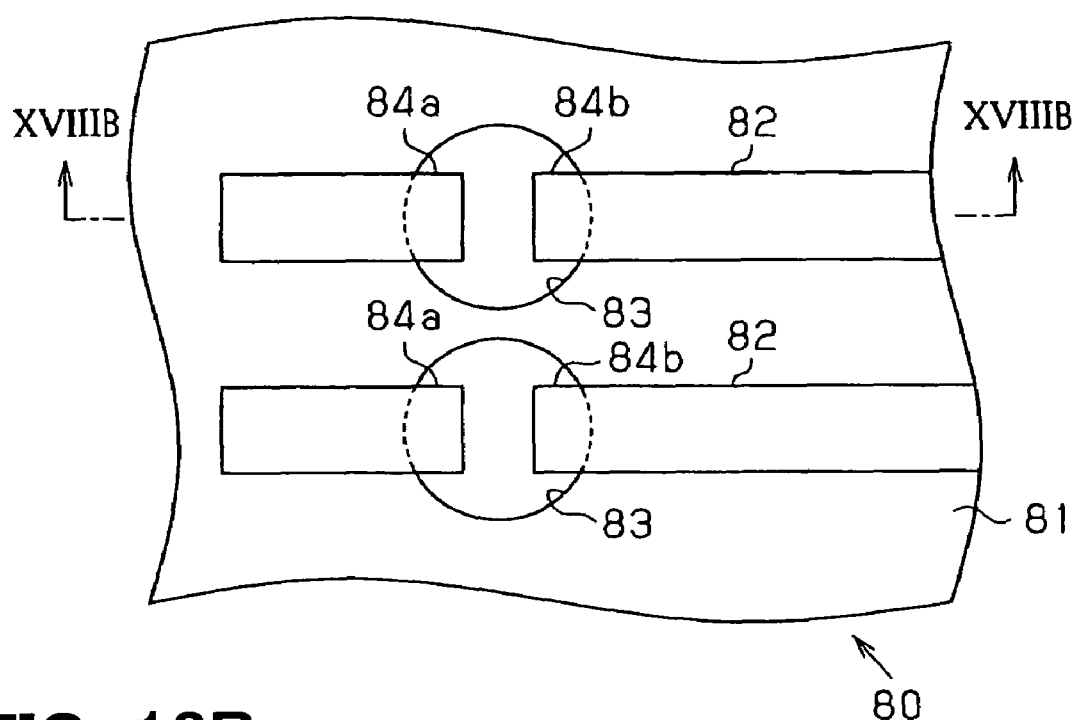
FIGS. 18A and 18B are enlarged views of the substrate for mounting semiconductor chip of the third embodiment.

FIGS. 17A and 17B are vertical cross-sectional views before and after the mounting of the semiconductor chip in this third embodiment. FIG. 18A is an enlarged plan view of the substrate 80 for mounting the semiconductor chip in this embodiment, while FIG. 18B is a vertical cross-sectional view along the line XVIIIB—XVIIIB in FIG. 18A.

Figure 18B:
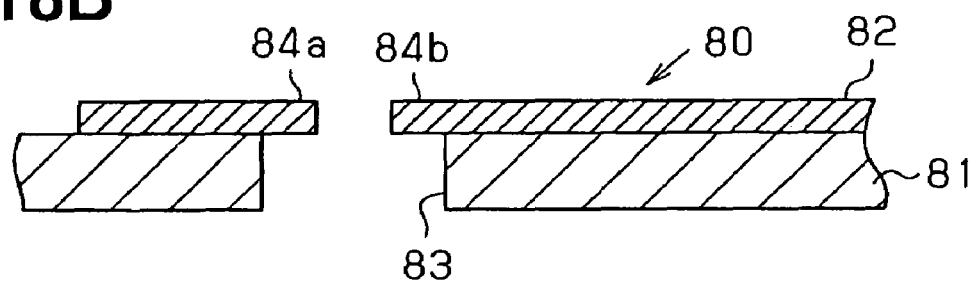

In FIGS. 18A and 18B, the substrate 80 for mounting the semiconductor chip includes the wire 82 patterned over the surface of the insulation base material sheet 81. As the insulation base material 81, the glass and epoxy base materials can be used. Moreover, the wire 82 is constructed by sequentially forming the nickel film and gold plated film over the patterned copper foil. The semiconductor chip 20 is flip chip mounted on this substrate 80 for mounting semiconductor chip.

Moreover, the through-hole 83 is formed through the insulation base material 81 in the substrate 80 for mounting the semiconductor chip and this through-hole 83 is formed at the allocating position of bump 21 of the semiconductor chip 20 to be mounted. This through-hole 83 is formed to insert the bump 21. The through-hole 83 has the circular plane shape. At the aperture of the through-hole 83, a part of the wire 83 is projected to the aperture of the through-hole 83 as the projected portions 84a and 84b.

The through-hole 83 may be individually allocated in each connecting point or a continuous through-hole may also be formed for a plurality of connecting points.

Figure 19A:
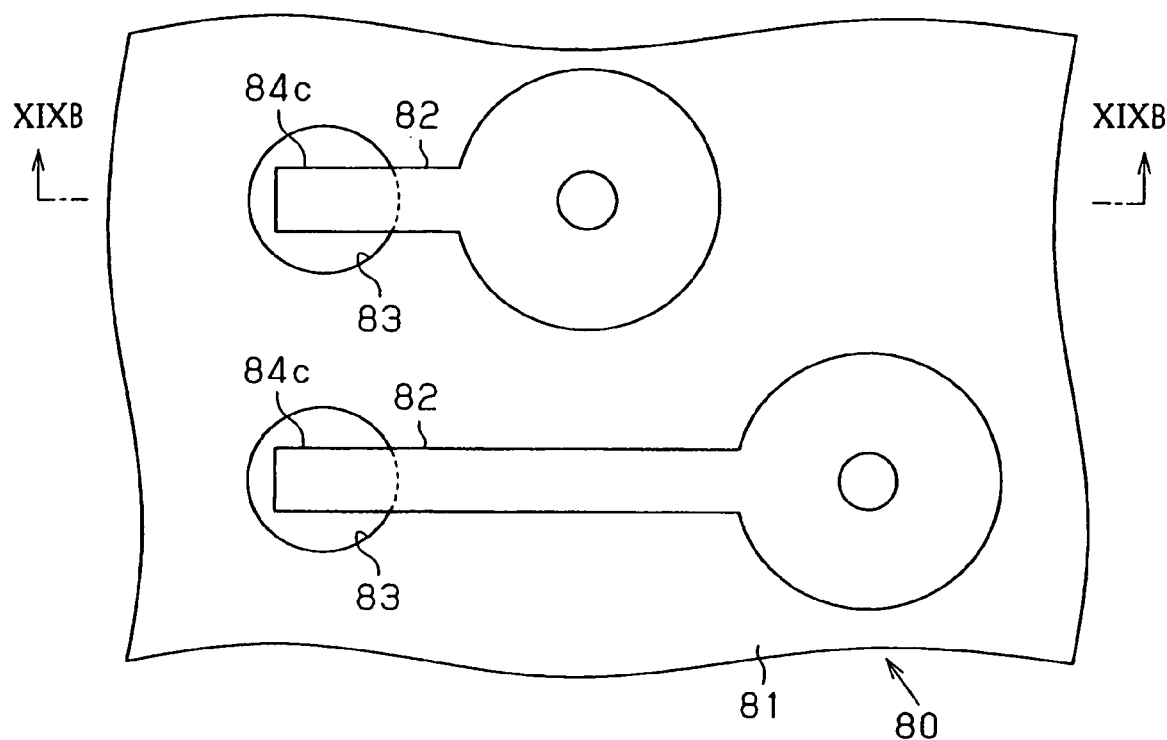
FIGS. 19A and 19B are enlarged views of the other example of substrate for mounting semiconductor chip.
Figure 19B:
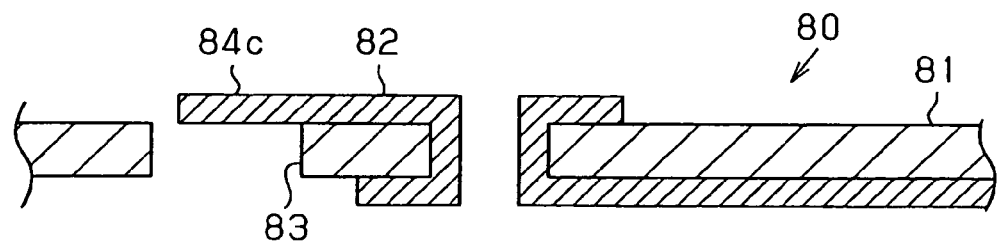

The projected portions 84a and 84b of the wire 82 are formed, as illustrated in FIGS. 18A and 18B, by edging (not illustrated) one wire at the center of the connecting point. As an alternative structure, the projected portion 84c may also be formed by projecting the wire 82 from one direction as illustrated in FIGS. 19A and 19B.

Next, the process for flip chip mounting semiconductor chip 20 to the substrate 80 for mounting semiconductor chip will be described with reference to FIGS. 17A and 17B.

The substrate 80 for mounting the semiconductor chip illustrated in FIGS. 18A and 18B is prepared and the semiconductor chip 20 provided with the bump 21 is mounted to the substrate 80, as illustrated in FIG. 17A, from the side of a surface where a part of the wire is projected to the aperture of the through-hole 83 while the bump 21 and through-hole 83 are matched in the position. Under the condition that the bump 21 and through-hole 83 are matched in the position, the bump 21 is inserted into the through-hole 83 as illustrated in FIG. 17B for the flip chip connection while at least heat and pressure are applied. In this case, since the bump 21 is inserted into the through-hole 83, the projected portions 84a and 84b of the wire are deformed and thereby the deformed projected portions 84a and 84b are electrically connected to the bump 21. In more detail, when the bump 21 is inserted into the through-hole 83, the projected portions 84a and 84b of the wire are deformed with the bump 21 and thereby the side surface of the bump 21 is connected with the projected portions 84a and 84b of the wire. At the time of insertion, the bump 21 and the projected portions of wire 84a and 84b are rubbed with each other. Accordingly, the oxide film is removed and new surfaces are generated. The metal coupling between the wire 82 and the bump 21 is formed through this process.

Figure 28A:
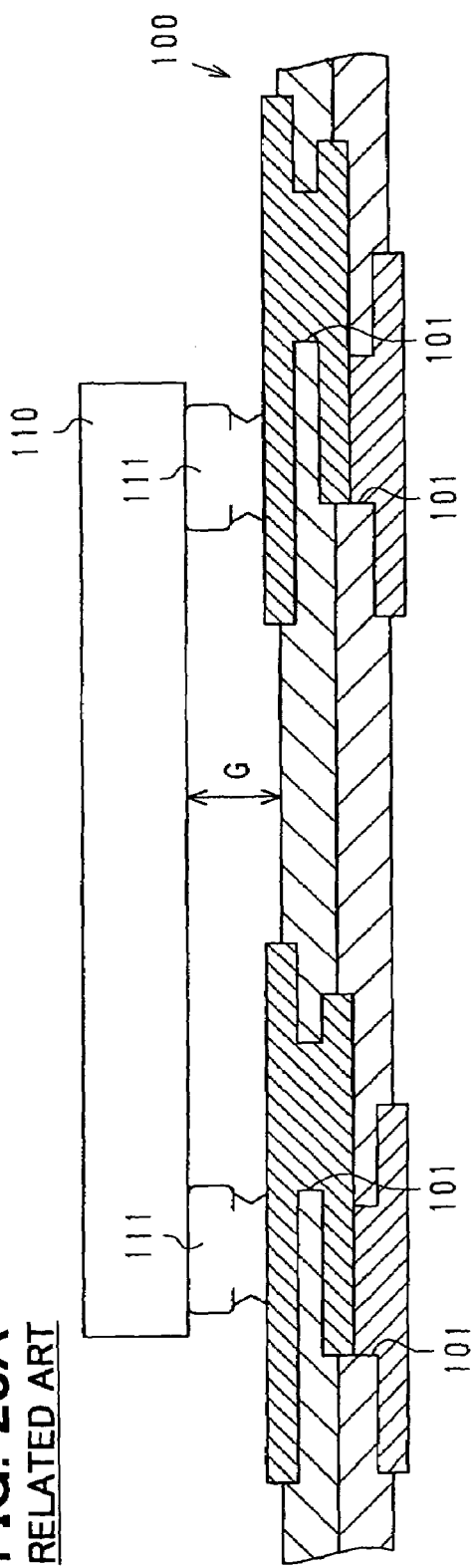
FIGS. 28A and 28B are vertical cross-sectional views of a related art device after the mounting.
Figure 28B:
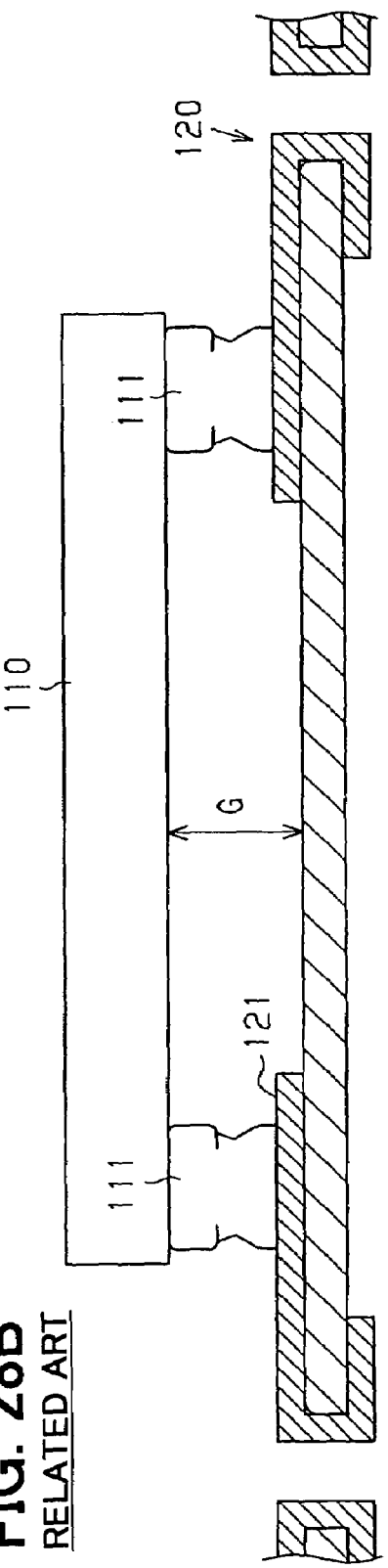

In this connection structure, since the wire 82 to be bonded with the bump 21 is not fixed to the base material 81, stress applied to the bonded area due to difference in the thermal expansion coefficients of the semiconductor chip 20 and the base material 81 can be alleviated through deformation of the wire 82. Accordingly, the connection reliability can be remarkably improved in comparison with the related art structure illustrated in FIG. 28B where the wire is fixed to the base material.

In such flip chip connection, it is recommended to set the heating temperature for ensuring a metal coupling to about 200° C. to 300° C. Moreover, in the mounting process described above, the semiconductor chip 20 has been mounted on the substrate 80 while heat and pressure are applied. In addition, it is also permitted that ultrasonic wave vibration be applied during the flip chip connection.

As the method of mounting the semiconductor chip described above, the semiconductor chip 20 provided with the bump 21 is flip chip connected to the substrate 80 from the surface where a part of the wire is projected to the aperture of the through-hole 83 under the condition that the bump 21 and the through-hole 83 are matched in the position by electrically connecting the deformed wire 82 and bump 21, while the bump 21 is inserted into the through-hole 83 by applying ultrasonic wave vibration thereto in order to form a metal coupling at the connecting portion of the bump 21 and the wire 82. Accordingly, since the surfaces of the bump 21 and the wire 82 are sharpened with the ultrasonic wave vibration and new surfaces are placed in contact with each other, the bump 21 and wire 82 surely form the metal coupling and the connection strength can be improved. Therefore, the flip chip connection reliability can further be improved (connection reliability becomes high.) In more detail, generation of new surfaces due to the sharpening of the surfaces of the bump 21 and wire 82 is stably accelerated, metal coupling between the bump 21 and wire 82 is surely formed, and the connection strength can be improved. Moreover, as the bump 21, it is recommended to use a gold stud bum which has been formed by welding a gold ball formed by discharge of gold wire to the electrodes of the semiconductor chip through application of ultrasonic wave vibration, heat, and pressure. Namely, the gold stud bump is suitable because it is high and soft and enters the through-hole 83 resulting in plastic deformation. Moreover, since a gold-plated film is formed over the wire surface, the gold-to-gold bonding is attained making easier the coupling.

Subsequently, in FIG. 17B, the under-fill material 30 is supplied to the gap between the substrate 80 and semiconductor chip 20. This under-fill material 30 diffuses the stress generated by the difference in the thermal expansion coefficients of the semiconductor chip 20 and the base material 81 not only to the bump 21 but also to the entire surface of the semiconductor chip 20. Accordingly, electrical connection reliability can be further improved for temperature difference which is repeatedly applied. This under-fill material 30 can also be supplied before the mounting of the semiconductor chip 20. In this case, the under-fill material 30 is hardened due to the heat generated when the semiconductor chip 20 is mounted. Fixing and sealing by the under-fill material 30 are completed simultaneously with the mounting of semiconductor chip 20. In this case, moreover, the time required for mounting of semiconductor chip 20 is set at least to the time required by the under-fill material 30 to be hardened temporarily. In more detail, temperature is set to 150° C. or higher and the time, to five seconds or longer.

As described above, the through-hole 83 provided through the insulation base material 81 is formed to insert the bump 21 at the allocating position in the substrate 80 for mounting the semiconductor chip. A part of the wire 82 is projected to the aperture of the through-hole 83 at the aperture of the through-hole 83. Accordingly, since the wire 82 of the connecting portion to the bump 21 by the flip chip connection is not fixed to the insulation base material 81, the stress alleviating capability of the wiring portion can be improved and the higher connection reliability can be attained.

Moreover, in the mounting structure of the semiconductor chip obtained (FIG. 17B), the semiconductor chip 20 provided with the bump 21 is flip chip connected to the substrate 80 for mounting the semiconductor chip from the surface where a part of the wire is projected to the aperture of the through-hole 83 under the condition that the bump 21 and through-hole 83 are matched in the position. The wire 82, which is deformed by insertion of the bump 21 into the through-hole 83, is electrically connected to the bump 21. According to this mounting structure of the semiconductor chip, since the wire of connecting portion to the bump 21 by the flip chip connection is not fixed to the insulation base material 81, the stress alleviating capability of the wiring portion can be improved and higher connection reliability can be attained.

(Fourth Embodiment)

Next, the fourth embodiment of the present invention will be described mainly in regard to differences from the third embodiment.

First, the substrate 80 for mounting the semiconductor chip illustrated in FIGS. 18A and 18B is prepared. As illustrated in FIG. 20A, the surface opposing to the surface to form the wire 82 in the substrate 80 for mounting semiconductor chip is defined as the semiconductor chip mounting surface and the bonding agent 85 is supplied (for the coating) to this surface. As illustrated in FIG. 20B, the through-hole 83 of substrate 80 and the electrode 87 of semiconductor chip 86 are matched in the position, and the semiconductor chip 86 is mounted to the substrate 80 in the face down manner.

Next, the substrate 80 is set upside down and the bump 88 similar to that described above is bonded to the electrode 87 of semiconductor chip via the through-hole 83 from the side of projected wire in the substrate 80 as illustrated in FIG. 20C. When the bump 88 is bonded, the projected portions 84a and 84b of wire are deformed and the wire 82 is electrically connected to the semiconductor chip 86 based on the principle described in the third embodiment. In addition to the effect of the third embodiment that the connection reliability can be improved, connection of wire 82 and electrode 87 is completed in the bonding process of the bump 88. That is, the subsequent flip chip process can be eliminated to simplify the total processes. The bonding agent 85 may also be hardened with the heat used for the bonding process of bump 88. Or, it is also allowed that the bonding agent hardening process is conducted before the bonding of the bump 88.

Moreover, the following processes are performed as required. The bump 88 is leveled by applying pressure with a leveling tool 89, as illustrated in FIG. 21A, to a part of the bump 88 projected from the upper surface of substrate 80. As a result, since the bump 88 is deformed, the bump 88 catches more effectively the projected portions 84a and 84b of the wire as illustrated in FIG. 21B, and thereby such electrical connection can be more stabled.

As the method of mounting the semiconductor chip, the semiconductor chip 86 is mounted in the face down manner via the bonding agent 85 to the surface opposing to the surface where a part of wire is projected to the aperture of the through-hole 83 in the substrate 80 for mounting the semiconductor chip under the condition that the electrode 87 of the semiconductor chip and the through-hole 83 are matched in the position (first process). Next, the bump 88 is bonded to the electrode 87 of the semiconductor chip by inserting the bump 88 into the through-hole 83 from the surface where a part of the wire is projected to the through-hole 83 in the substrate 80 for mounting the semiconductor chip (second process). According to this method, since the wire of the connecting portion to the bump 88 by the flip chip connection is not fixed to the insulation base material 81, the stress alleviating capability of the wiring portion can be improved and higher connection reliability can also be attained. Moreover, since mounting of the bump 88 to the electrode 87 and connection between the bump 88 and the wire 82 can be performed simultaneously in the bonding process of the bump 88, the processes can be simplified. Particularly, after the bump 88 is bonded to the electrode 87 of the semiconductor chip, the structural member of the bump 88 projected from the front surface of the substrate 80 for mounting the semiconductor chip is pressed and crushed from the side of the surface where a part of the wire is projected to the aperture of the through-hole 83. Accordingly, since the bump is crushed (plastically deformed), the bonding area of wires (84a and 84b) projected to the aperture of through-hole 83 and bump 88 increases and electrical connection reliability can also be increased.

In the mounting structure of the semiconductor chip of FIG. 20C, the semiconductor chip 86 is bonded in the face down manner to the substrate 80 from the side of the surface opposing to the surface where a part of wire is projected to the aperture of through-hole 83 under the condition that the electrode 87 of the semiconductor chip 86 and the through-hole 83 are matched in the position. Moreover, the wire 82, which is deformed because the bump 88 is inserted into the through-hole 83 from the surface where a part of the wire is projected to the aperture of the through-hole 83 and thereby it is bonded to the electrode 87 of semiconductor chip, is electrically connected to the bump 88. According to this mounting structure of semiconductor chip, since the wire of connecting portion to the bump 88 by the flip chip connection is not fixed to the insulation base material 81, the stress alleviating capability of wiring portion can be improved and thereby higher connection reliability can be attained.

Moreover, the end part of thin wire (gold wire) is torn off upon bonding as illustrated in FIG. 20C, but it is also possible to bond such end part to the wire 82 near the through-hole 83 as illustrated in FIG. 22. When the end part of the bump 88 is wire-bonded to the wire 83, electrical connection of thin wire (gold wire) can be maintained. Accordingly, the thin wire (gold wire) 90 has excellent stress alleviating capability and can improve reliability of connection. Namely, the thin wire (gold wire) 90 has excellent stress alleviating capability and surely attains higher reliability even if the projected portions 84a and 84b of wire are broken.

(Fifth Embodiment)

Next, the fifth embodiment of the present invention will be described mainly in regard to differences from the third embodiment.

First, the substrate 80 for mounting the semiconductor chip illustrated in FIGS. 19A and 19B is prepared. As illustrated in FIG. 23A, the surface opposing to the surface where the wire 82 is formed in the substrate 80 for mounting the semiconductor chip is defined as the semiconductor chip mounting surface and this surface is thereafter supplied (coated) with a bonding agent 91. Next, as illustrated in FIG. 23B, the semiconductor chip 86 is mounted in the face down manner to the substrate 80 under the condition that the through-hole 83 of the substrate 80 and the electrode 87 of the semiconductor chip are matched in the position.

Figure 24A:
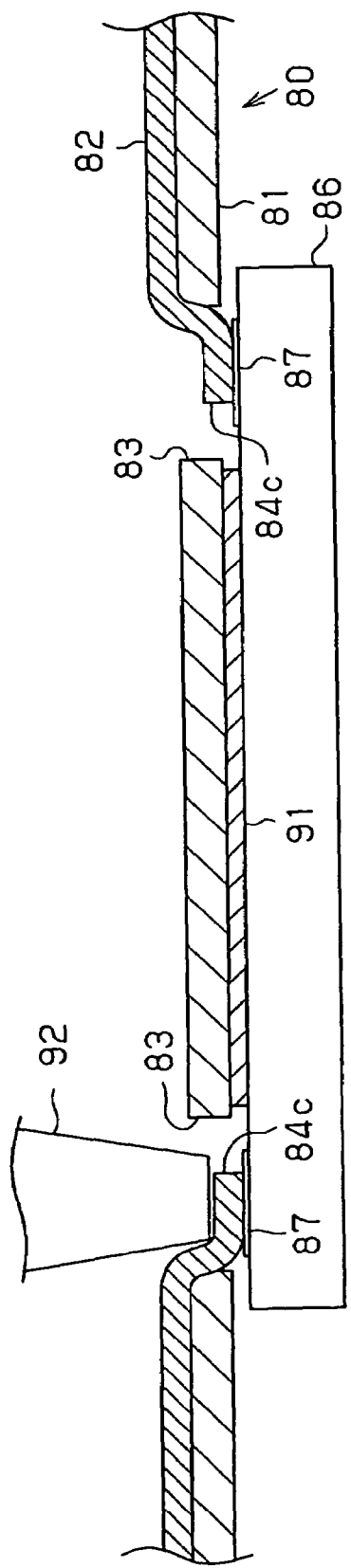
FIGS. 24A and 24B are vertical cross-sectional views for explaining the flip chip mounting process in the fifth embodiment.

Moreover, as illustrated in FIG. 24A, the substrate 80 is placed upside down and the end part of a bonding tool 92 is inserted into the through-hole 83 from the side of the projected wire of the substrate 80 in order to put the projected portion 84c of the wire on the electrode 87 of the semiconductor chip and then bond the end part of wire and the electrode through application of ultrasonic wave vibration. Namely, the substrate 80 for mounting the semiconductor chip in this embodiment has the structure that the through-hole 83 provided through the insulation base material 81 is formed to insert the end part of the bonding tool 92 at the allocating position of the electrode 87 of the semiconductor chip 86 to be mounted and a part of the wire 82 is projected to the aperture of the through-hole 83. As the bonding tool 92 of FIG. 24A, a capillary is used. The bonding agent 91 is thermally hardened in the bonding process. As an alternative, it is also allowed that the bonding agent hardening process is prepared before the bonding process.

As a result, stress can be alleviated with the projected portion 84c of the wire which is not fixed to the base material 81 and thereby the connection reliability can be improved. That is, since the wire of the connecting portion to the electrode 87 on the chip side by the flip chip connection is not fixed to the insulation base material 81, the stress alleviating capability of the wiring portion can be improved and higher connection reliability can also be attained by using the substrate 80 including the through-hole 83 to insert the end part of the bonding tool 92.

As the mounting method of the semiconductor chip, as described above, the semiconductor chip 86 is mounted in the face down manner via the bonding agent 91 to the surface opposing to the surface where a part of wire is projected to the aperture of through-hole 83 in the substrate 80 for mounting the semiconductor chip under the condition that the electrode 87 of semiconductor chip and through-hole 83 are matched in the position (first process). Next, the wire (84C) projected to the aperture is bonded to the electrode 87 of semiconductor chip using the bonding tool 92 from the surface where a part of wire is projected to the aperture of the through hole 83 in the substrate 80 for mounting the semiconductor chip (second process). According to this method, since the wire of the connecting portion to the semiconductor chip 86 is not fixed to the insulation base material 81, the stress alleviating capability of the wiring portion can be improved and higher connection reliability can be attained.

Moreover, as the mounting structure of the semiconductor chip, the semiconductor chip 86 is bonded in the face down manner to the substrate 80 for mounting the semiconductor chip from the surface opposed to the surface where a part of the wire is projected to the aperture of the through-hole 83 under the condition that the electrode 87 of the semiconductor chip and the through-hole 83 are matched in the position. In addition, the wire (84C) projected to the aperture is bonded to the electrode 87 of the semiconductor chip and the wire 82 and the electrode 87 of semiconductor chip are electrically connected. According to this mounting structure of the semiconductor chip, since the wire 82 of the connecting portion to the semiconductor chip 86 is not fixed to the insulation base material 81, the stress alleviating capability of the wiring portion can be improved and higher connection reliability can be attained.

Figure 24B:
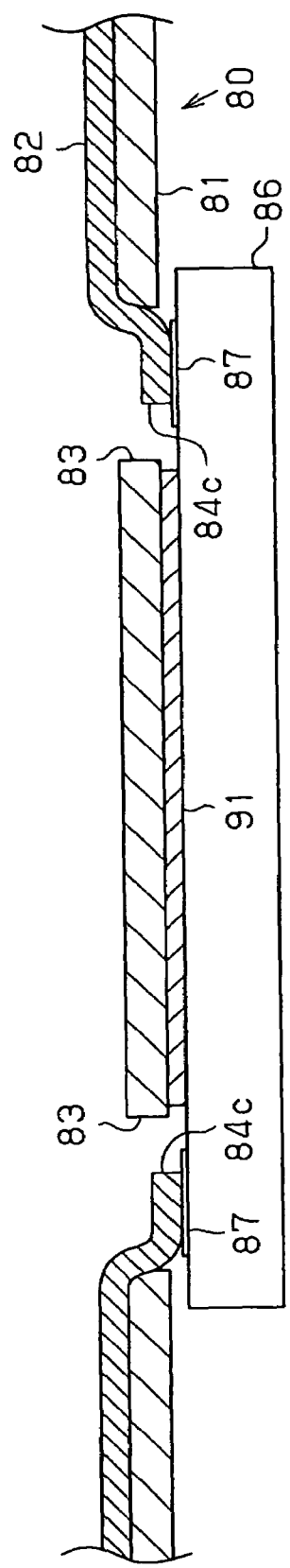
Figure 25A:
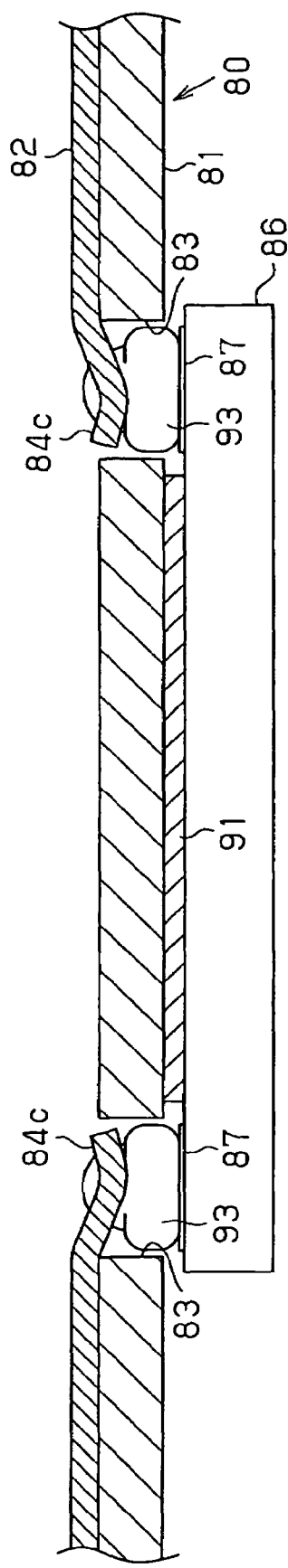
FIGS. 25A and 25B are vertical cross-sectional views illustrating the mounting structure of the other example of the semiconductor chip.
Figure 25B:
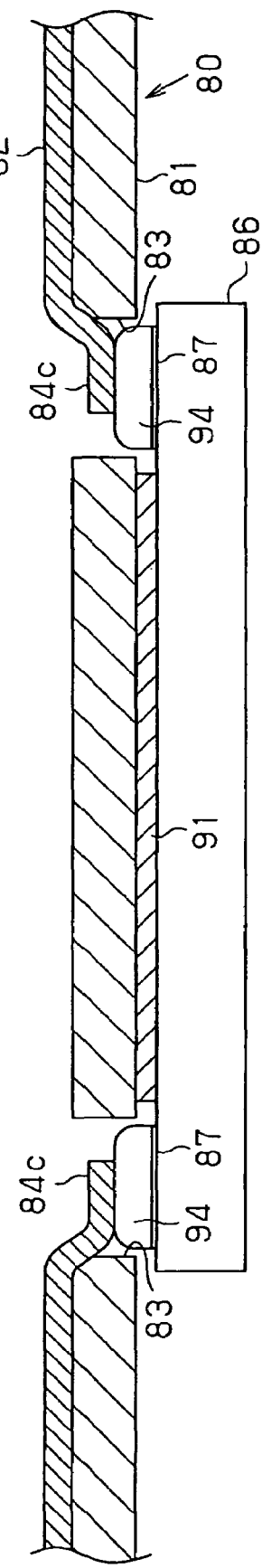

As an alternative of FIG. 24B, it is also possible to previously provide a stud bump 93 to the electrode 87 of the semiconductor chip as illustrated in FIG. 25A. Namely, as the mounting structure of the semiconductor chip, the semiconductor chip 86 with the stud bump 93 is formed on the electrode 87 is bonded in the face down manner to the substrate 80 for mounting the semiconductor chip from the surface opposed to the surface where a part of wire is projected to the aperture of through-hole 83 under the condition that the electrode 87 of the semiconductor chip and the through-hole 83 are matched in the position. Moreover, the wire (84C) projected to the aperture is bonded to the stud bump 93 of the semiconductor chip 86 and the wire 82 and electrode 87 of the semiconductor chip are electrically connected. According to this mounting structure of the semiconductor chip 86, since the wire of the connecting portion to the semiconductor chip 86 is not fixed to the insulation base material 81, the stress alleviating capability of the wiring portion can be improved and higher connection reliability can be attained. Moreover, the projected portion 84C of the wire sticks to the stud bump 93 because of plastic deformation of the stud bump 93 and thereby strong and stable connection can be obtained. Moreover, the gold-to-gold bonding of the gold-plated film of wire and gold stud bump 93 can be attained by utilizing the gold stud bump as the stud bump 93. Accordingly, a metal coupling can be obtained easily.

As an alternative of FIG. 24B, a plated bump 94 may be provided previously to the electrode 87 of semiconductor chip. Namely, as the mounting structure of semiconductor chip, the semiconductor chip 86 with the plated bump 94 formed to the electrode 87 is bonded in the face down manner to the substrate 80 for mounting the semiconductor chip from the surface opposing to the surface where a part of wire is projected to the aperture of through-hole 93 under the condition that the electrode 87 of semiconductor chip and through-hole are matched in the position. Moreover, the wire (84C) projected to the aperture is bonded to the plated bump 94 of semiconductor chip 86 and the wire 82 and electrode 87 of semiconductor chip are electrically connected. According to this mounting structure of the semiconductor chip, since the wire of the connecting portion to the semiconductor chip 86 is not fixed to the insulation base material 81, the stress alleviating capability of the wiring portion can be improved and higher connection reliability can be attained. In addition, the plated bump 94 shows less plastic deformation (because it is hard) and when the ultrasonic wave vibration is applied during the bonding of projected portion 84C of wire, the vibration is transferred stably to the interface of bonding and thereby stable bonding effect can be attained. In addition, since the plated bump 94 can be formed simultaneously under the wafer condition, reduced manufacturing cost can be attained in comparison with the stud bump. Furthermore, the gold-to-gold junction of the gold plated film of wire and gold plated bump 94 can be attained by utilizing the gold plated bump as the plated bump 94. Accordingly, the metal coupling can be obtained easily.

Thickness of substrate described in the three to fifth embodiments will be described. As illustrated in FIG. 17, thickness tS of the substrate is preferably identical to the thickness tB of the bump 21. The preferable thickness of the substrate ranges from 5 μm to 100 μm. Accordingly, it is recommended to use a flexible substrate in which the base material 81 is formed of polyimide. Moreover, in the fifth embodiment illustrated in FIGS. 23A, 23B and FIGS. 24, 24B, it is better to use a thinner substrate 80. This is because the projected portion 84C of wire can be easily bonded to the electrode 87 of chip through deformation. In practice, for example, the thickness of the insulation base material 81 is set to 25 μm, while the thickness of the wire 82 is set to 17 μm, and the thickness of the bonding agent 91 is set to 10 to 15 μm. Generally, it is recommended to set the thickness of the insulation base material 81 to two times or less the thickness of the wire 82 (for example, when the thickness of wire 82 is 15 μm, the thickness of insulation base material 81 is 30 μm or less).

(Sixth Embodiment)

Next, the sixth embodiment will be described mainly in regard to differences between the fourth and fifth embodiments.

Figure 26A:
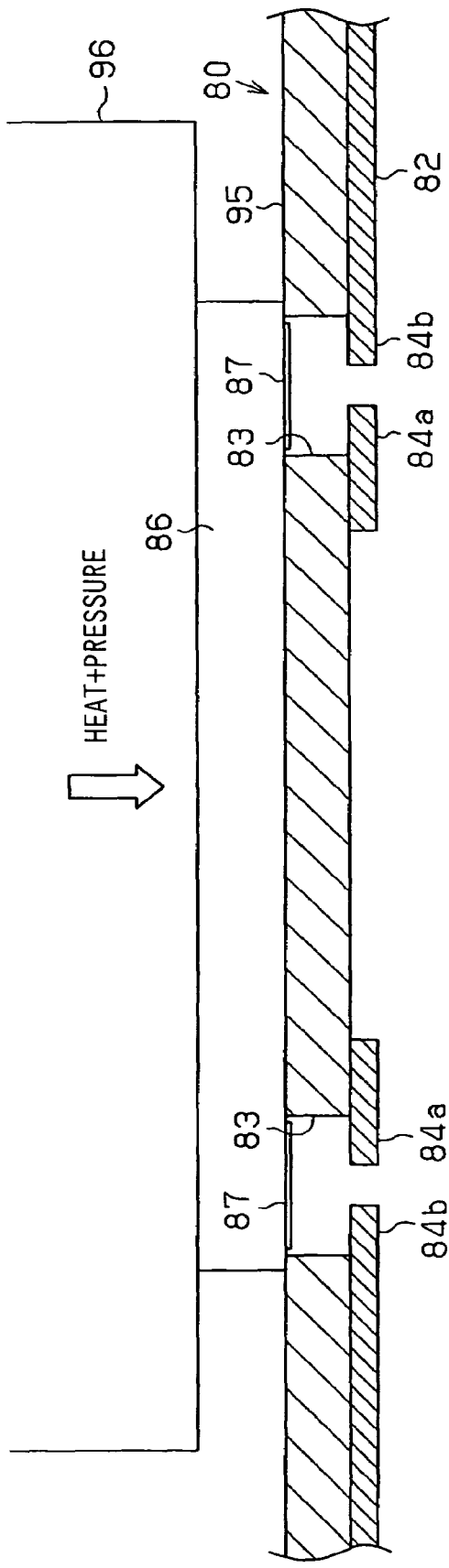
FIGS. 26A and 26B are vertical cross-sectional views for explaining the flip chip mounting process in the sixth embodiment.
Figure 26B:
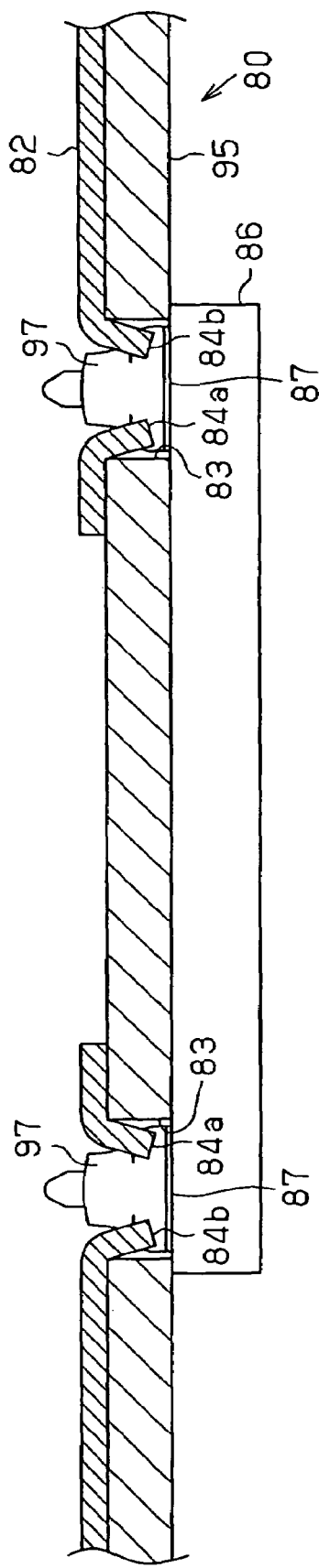

As illustrated in FIGS. 26A and 26B, an insulation base material 95 of the substrate 80 is formed of thermoplastic resin base material and the semiconductor chip 86 is mounted on the substrate 80. Polyimide may be selected as the thermoplastic resin base material. The mounting structure illustrated in FIG. 20B, FIG. 22, FIG. 24B, FIG. 25A, and FIG. 25B is formed using the substrate 80.

In this case, the semiconductor chip 86 is bonded directly to the substrate 80 without use of bonding agent.

That is, as the mounting method using this base material, the semiconductor chip 86 is fixed to the substrate 80 through the compression bonding of about 10 seconds under 200° C. to 300° C., as illustrated in FIG. 26A, by positioning the semiconductor chip 86 to the substrate 80 and thereafter applying a bonding head 96 to the semiconductor chip 86. Namely, the semiconductor chip 86 is fixed, with the thermal compression bonding, to the insulation base material 95 formed of the thermoplastic resin base material, in the face down manner, on the surface opposing to the surface where a part of the wire is projected to the aperture of the through-hole 83 in the substrate 80 for mounting the semiconductor chip provided with the through-hole to insert the bump under the condition that the electrode 87 of semiconductor chip and through-hole 83 are matched in the position (first process). Thereafter, the substrate 80 is placed upside down and a bump 97 is bonded to the electrode 87 of the semiconductor chip via the through-hole 83 of the substrate 80 as illustrated in FIG. 26B. Namely, the bump 97 is inserted into the through-hole 83 from the surface where a part of the wire is projected to the aperture of the through-hole 83 in the substrate 80 for mounting the semiconductor chip and thereby the bump 97 is bonded to the electrode 87 of the semiconductor chip (second process). According to this method, since the wire of the connecting portion to the bump 97 by the flip chip connection is not fixed to the insulation base material 81, the stress alleviating capability of the wiring portion can be improved and higher connection reliability can be attained. Moreover, since the mounting of the bump 97 to the electrode 87 and connection between the bump 97 and the wire 82 can be conducted simultaneously in the bonding process of the bump 97, the processes can be simplified. In addition, the semiconductor chip 86 can be bonded to the base material through the thermal compression bonding using the thermoplastic resin base material, the bonding agent can be eliminated, and the coating process of the bonding agent (bonding agent supplying process) can also be eliminated. The bonding principle is similar to that in the fourth embodiment.

Next, bonding of the projected portion 84C of wire to the electrode 87 of semiconductor chip 86 will be described with reference to FIGS. 27A, 27B, and 27C.

As illustrated in FIG. 27A, the substrate 80 for mounting the semiconductor chip includes the through-hole 83 to insert the end part of the bonding tool. The semiconductor chip 86 is fixed, in the face down manner, through the thermal compression bonding to the insulation base material 95 consisting of the thermoplastic resin base material to the surface opposing to the surface where a part of the wire is projected to the aperture of through-hole 83 in the substrate 80 (first process). In this case, heat and pressure are applied using the bonding head 96. Next, as illustrated in FIG. 27B, the wire (84C) projected to the aperture is bonded, as illustrated in FIG. 27B, to the electrode 87 of the semiconductor chip with the bonding tool 92 from the surface where a part of the wire is projected to the aperture of the through-hole 83 in the substrate 80 for mounting the semiconductor chip (second process). As a result, as illustrated in FIG. 27C, the projected portion of the wire 84C is bonded to the electrode 87 of the semiconductor chip. According to this method, since the wire of the connecting portion to the semiconductor chip 86 is not fixed to the insulation base material 95, the stress alleviating capability of the wiring portion can be improved and higher connection reliability can be attained. Moreover, the semiconductor chip 86 can be bonded to the base material through the thermal pressure bonding by utilizing the thermoplastic resin base material. Accordingly, the bonding agent is no longer required and the bonding agent coating process (bonding agent supplying process) can also be eliminated.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A chip assembly comprising:
   a multilayer substrate with alternate layers of insulation layers and wiring layers, wherein the wiring layers are electrically connected through a via-hole for interlayer continuity, the substrate including a through-hole extending through an outermost insulation layer and a plurality of wires that extend into the through-hole, and wherein the through-hole includes a bottom surface; and
   a semiconductor chip that is flip chip mounted to the substrate, wherein the semiconductor chip includes a bump, wherein the bump is provided within the through-hole, wherein the wires of the substrate are in abutting contact with the bump and are bent toward an axis of the bump for electrical connection therebetween, and wherein a deformed end of the bump abuts against the bottom surface of the through-hole,
   wherein a space is defined laterally between the wires, and wherein the deformed end of the bump has a lateral width that is greater than the space defined laterally between the wires.

2. The chip assembly according to claim 1, wherein the through-hole also extends through an internal insulation layer, and wherein the wires are part of an internal wiring layer.

3. The chip assembly according to claim 1, further comprising a silver paste included within the through-hole.

4. The chip assembly according to claim 1, wherein at least the outermost insulation layer is formed of thermoplastic resin.

5. The chip assembly according to claim 4, wherein the semiconductor chip provided with the bump is flip chip connected to the thermoplastic resin layer of the substrate.

6. A chip assembly comprising:
   a substrate with an insulation layer and a wiring layer, the substrate including a through-hole extending through the insulation layer and the wiring layer such that a plurality of wires of the wiring layer extend into the through-hole, wherein the wires are included on a first side of the substrate;
   a semiconductor chip that is flip chip mounted to the substrate such that the semiconductor chip is bonded face down to a second side of the substrate that is opposite to the first side;
   a bump provided within the through-hole, wherein the wires of the substrate are in abutting contact with the bump and are bent toward an axis of the bump,
   wherein a space is defined laterally between the wires, and wherein a deformed end of the bump has a lateral width that is greater than the space defined laterally between the wires.

7. The chip assembly according to claim 6, wherein the bump is electrically connected to the wire.

8. The chip assembly according to claim 6, further comprising an insulation base material formed of a thermoplastic resin base material.

* * * * *